(12) United States Patent
Hamada et al.

(10) Patent No.: US 7,038,969 B2
(45) Date of Patent: May 2, 2006

(54) SEMICONDUCTOR MEMORY HAVING A SPARE MEMORY CELL

(75) Inventors: Makoto Hamada, Kanagawa (JP);
Kazuyoshi Muraoka, Kanagawa (JP);
Masahiro Yoshihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 10/940,635

(22) Filed: Sep. 15, 2004

(65) Prior Publication Data

US 2005/0088874 A1  Apr. 28, 2005

(30) Foreign Application Priority Data

Sep. 16, 2003 (JP) ............................. 2003-322585
Aug. 27, 2004 (JP) ............................. 2004-248251

(51) Int. Cl.
*G11C 7/00* (2006.01)

(52) U.S. Cl. ..................................... 365/222; 365/200
(58) Field of Classification Search ................ 365/200, 365/222, 225.7
See application file for complete search history.

(56) References Cited

U.S. PATENT DOCUMENTS

| | | | | |
|---|---|---|---|---|
| 5,983,367 | A | * 11/1999 | Higuchi et al. | ............... 714/42 |
| 6,366,515 | B1 | * 4/2002 | Hidaka | ........................ 365/222 |
| 6,421,284 | B1 | * 7/2002 | Sakata | ........................ 365/200 |
| 6,480,430 | B1 | 11/2002 | Sato | |
| 6,501,817 | B1 | 12/2002 | Parris et al. | |

FOREIGN PATENT DOCUMENTS

JP  10-69798  3/1998

\* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory encompasses a memory cell array having a spare memory cell array; a holding circuit having banks of fuses, configured to read and hold fuse information; a decision circuit configured to determine which address of memory cell is to be replaced with which spare memory cell based on the fuse information from the holding circuit; and a holding-controller configured to control reading and holding of the fuse information in the holding circuit by receiving a power supply completion signal and a refresh signal. The holding circuit rereads the fuse information when the reread signal is generated, after the holding circuit reads once the fuse information by receiving the power supplying completion signal.

19 Claims, 19 Drawing Sheets

SEMICONDUCTOR MEMORY HAVING A SPARE MEMORY CELL

CROSS REFERENCE TO RELATED APPLICATIONS

This application claims benefit of priority under 35 USC 119 based on Japanese Patent Application No. P2003-322585 filed Sep. 16, 2003, and Japanese Patent Application No. P2004-248251 filed Aug. 27, 2004, the entire contents of which are incorporated by reference herein.

BACKGROUND OF THE INVENTION

1. Field of the Invention

The present invention relates to a semiconductor memory having a fuse circuit. It is particularly related to a semiconductor memory having a preferred configuration for continuous operation.

2. Description of the Related Art

A method of preparing spare memory cells in a semiconductor memory as countermeasures for defective memory cells and replacing the defective memory cells with the spare memory cells based on fuse information is employed.

A 'fuse' represents a logic state "0" or "1" determined by whether an electric conductor is conductive or disconnected; 'fuse information' means information for determining which address of memory cell is to be replaced with which spare memory cell; and a 'fuse circuit' means a circuit that provides fuse information for memory cells of the semiconductor memory.

The semiconductor memory having a fuse circuit is implemented by: a plurality of memory cell arrays; holding circuits, each being provided for each memory cell array and reading and holding fuse information; decision circuits, each being provided for each memory cell array and determining which address of memory cell is to be replaced with which spare memory cell based on the fuse information from corresponding holding circuit; and holding-controllers, which control reading and holding of the fuse information in the holding circuits. With an earlier semiconductor memory having such configuration, to begin with, a power supply completion signal POWERON, which is for notifying that an internal potential has been set once an electric power is supplied to the semiconductor memory, is transferred to the holding-controllers.

A holding-controller provides an initialization signal bFPUP to holding circuits once the power supply completion signal POWERON is transferred, and then after a specified period has passed, provides a determination signal FPUN to those holding circuits. The holding circuit initializes fuse information using the initialization signal bFPUP, reads the fuse information using the determination signal FPUN, and continues to hold that fuse information. The decision circuit determines which address of memory cell is to be replaced with which spare memory cell based on the fuse information from respective holding cell every time a memory cell is accessed. Accordingly, a defective memory cell among memory cells in respective memory cell arrays is replaced with a spare memory cell so as to serve as a normal memory cell.

In this manner, fuse information is read only once when power is supplied to the semiconductor memory, and is then held in that holding circuit. However, since the fuse information being held in the holding circuits may change from when it is read with an alpha particles soft error or unexplained disturbance noise, there is a problem where the decision circuit cannot accurately replace the defective memory cell with a spare memory cell, and the defective memory cell remains.

As a result, if such a semiconductor device is used for a system with which supplying power to such semiconductor memory is difficult, such as a device having to continuously run without even an instantaneous malfunction, or a communications network server, there is fear of causing critical failure of that system.

On the contrary, Japanese Patent Application Laid-open Hei 10-69798 discloses a semiconductor memory having a fuse circuit that is configured such as to correct an erroneously set state. The semiconductor memory disclosed in the Japanese Patent Application includes a fuse/latch circuit, which is implemented by three serially connected MOSFETs and an inverter; wherein the set state of the fuse/latch circuit, which is driven by pulse signals CLRNX, SETPX and SETPSP during an initializing sequence after power is supplied, is evaluated, and only the erroneously set fuse/latch circuit is correctly reset.

However, there is a problem with the semiconductor memory disclosed in the Japanese Patent Application where since evaluation of the set state of the fuse/latch circuit and correction of the erroneously set state are executed during the initializing sequence carried out immediately after power is supplied, the fuse information in an erroneous state after completion of the initializing sequence is not corrected.

As such, there is the problem with the semiconductor memory including the earlier fuse circuit where as long as power is not re-supplied when the fuse information is in an erroneously set state due to a malfunction, the erroneously set state cannot be corrected. As a result, there is fear of causing critical failure of a system with which re-supplying power to the earlier semiconductor memory is difficult. Particularly, there is a problem with the semiconductor memory disclosed in Japanese Patent Application where the fuse information in an erroneous state after completion of the initializing sequence carried out immediately after power is supplied is not corrected.

SUMMARY OF THE INVENTION

An aspect of the present invention inheres in a semiconductor memory encompassing (a) a memory cell array having a spare memory cell array; (b) a holding circuit having banks of fuses, configured to read and hold fuse information; (c) a decision circuit configured to determine which address of memory cell is to be replaced with which spare memory cell based on the fuse information from the holding circuit; and (d) a holding-controller configured to control reading and holding of the fuse information in the holding circuit by receiving a power supply completion signal and a refresh signal, wherein the holding circuit rereads the fuse information when the reread signal is generated, after the holding circuit reads once the fuse information by receiving the power supplying completion signal.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

(First Embodiment)

Figure 1:
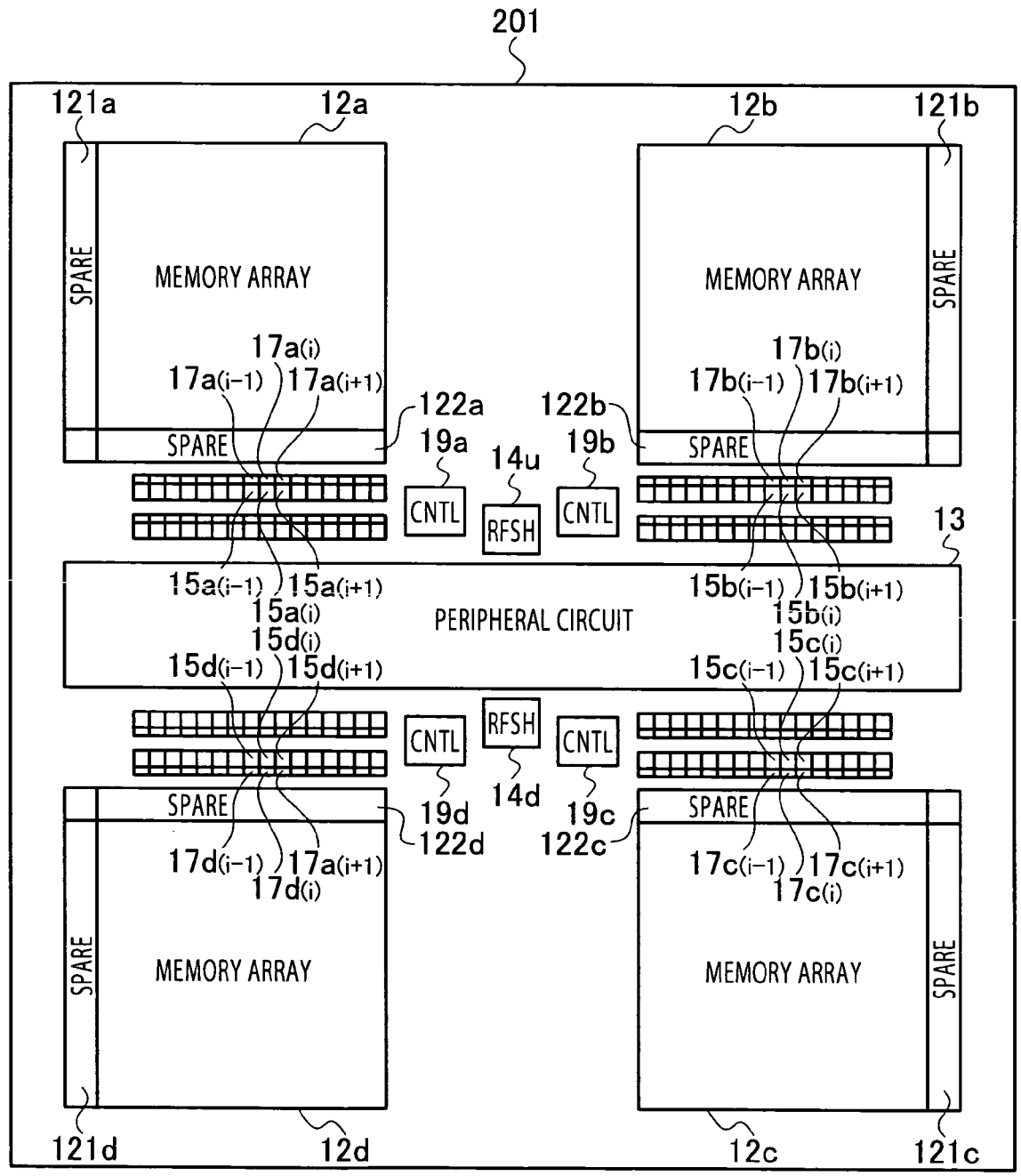
FIG. 1 is a plan view showing a schematic layout on a semiconductor chip of a semiconductor memory according to the first embodiment of the present invention.

As shown in FIG. 1, a semiconductor memory 201 according to a first embodiment of the present invention encompasses a plurality of memory cell arrays 12a, 12b, 12c, and 12d; refresh controllers 14u and 14d, configured to deliver refresh signals to the memory cell arrays 12a, 12b, 12c, and 12d; holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , configured to read and hold fuse information; decision circuits 17a(i−1), 17a(i), 17a(i+1), . . . , 17b(i−1), 17b(i), 17b(i+1), . . . , 17c(i−1), 17c(i), 17c(i+1), . . . , 17d(i−1), 17d(i), 17d(i+1), . . . , configured to determine which address of memory cell is to be replaced with which spare memory cell based on the fuse information from the holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , respectively; and holding-controllers 19a, 19b, 19c, and 19d, configured to control reading and holding of the fuse information in the holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , by receiving a power supply completion signal and a refresh signal. The refresh signals delivered from the refresh controllers 14u and 14d are employed as "reread signals".

The holding circuits 15a(i−1), 15a(i), 15a(i+1), . . . , are assigned to the memory cell array 12a. Similarly, the holding circuits 15b(i−1), 15b(i), 15b(i+1), . . . , 15c(i−1), 15c(i), 15c(i+1), . . . , 15d(i−1), 15d(i), 15d(i+1), . . . , are assigned to the memory cell arrays 12b, 12c, and 12d, respectively. The decision circuits 17a(i−1), 17a(i), 17a(i+1), . . . , are assigned to the memory cell array 12a. Similarly, the decision circuits 17b(i−1), 17b(i), 17b(i+1), . . . , 17c(i−1), 17c(i), 17c(i+1), . . . , 17d(i−1) 17d(i), 17d(i+1), . . . , are assigned to the memory cell arrays 12b, 12c and 12d, respectively. The holding-controllers 19a, 19b, 19c, and 19d are assigned to the memory cell arrays 12a, 12b, 12c, and 12d, respectively.

The configuration having the upper refresh controller 14u and the lower refresh controller 14d shown in FIG. 1 is merely an example, and another configuration having a single refresh controller configured to deliver refresh signals to the memory cell arrays 12a, 12b, 12c, and 12d as reread signals can be employed.

In FIG. 1, the memory cell arrays 12a and 12b are arranged on the upper side of the semiconductor memory 201, and the memory cell arrays 12c and 12d are arranged on the lower side. In addition, a peripheral circuit 13 is located in the central region of the semiconductor memory 201, namely between the memory cell arrays 12a and 12b arranged in the upper section and the memory cell arrays 12c and 12d arranged in the lower section. Although details are omitted, the peripheral circuit 13 may include a column decoder and a row decoder. Alternatively, it may have a configuration such that a row decoder is arranged on the upper side between the memory cell arrays 12a and 12b arranged on the upper side, and a row decoder is arranged on the lower side between the memory cell arrays 12c and 12d arranged on the lower side.

Figure 3:
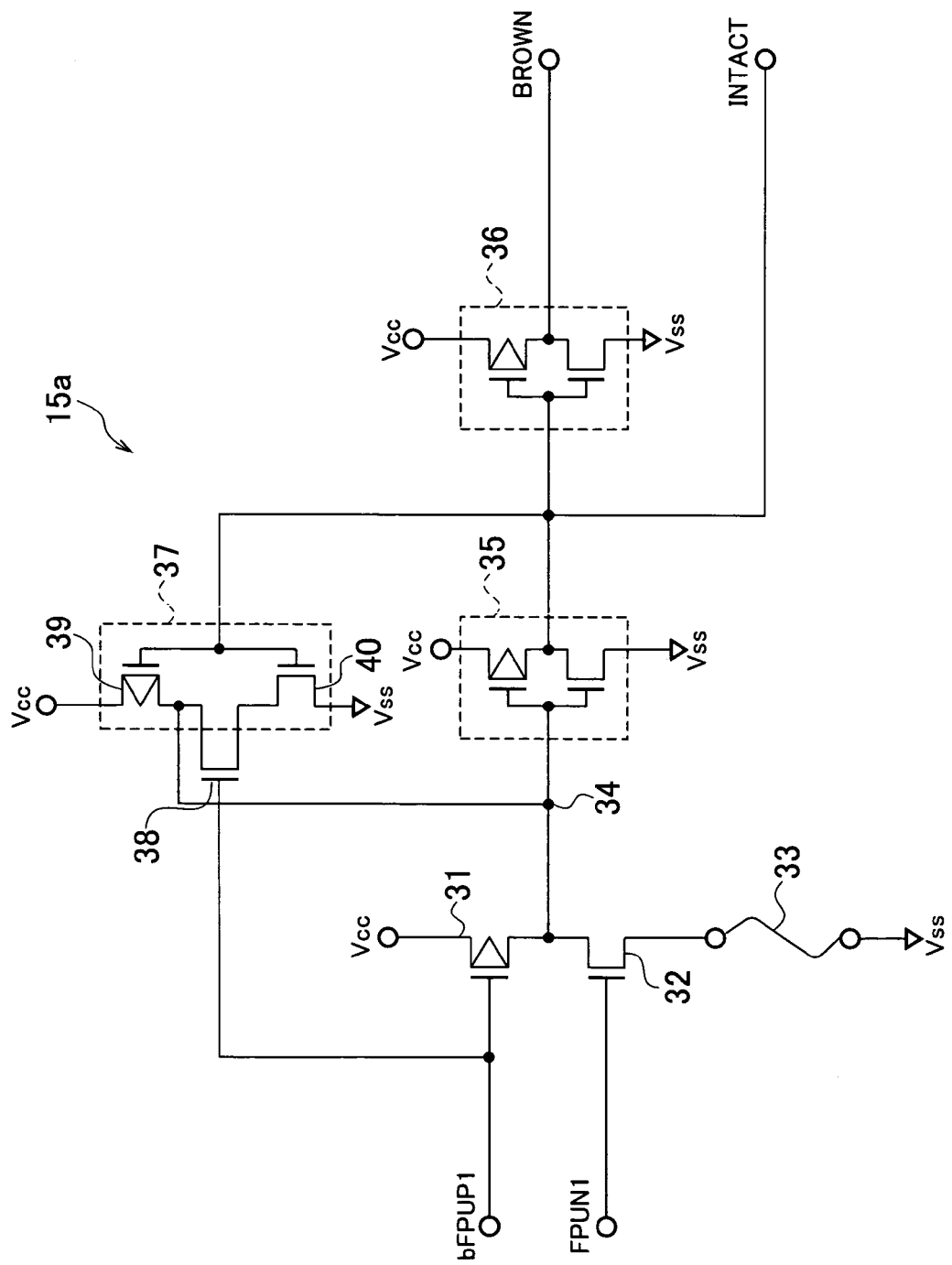
FIG. 3 is a diagram showing a holding circuit of the semiconductor memory according to the first embodiment of the present invention.

The upper side memory cell array 12a includes a column spare memory cell array 121a and a row spare memory cell array 122a. The column spare memory cell array 121a can replace, for example, a predetermined number of columns of memory cells in the memory cell array 12a. The row spare memory cell array 122a can also similarly replace a predetermined number of memory cells in the memory cell array 12a. The holding circuits 15a(i−1), 15a(i), 15a(i+1), . . . include banks of fuses corresponding to the column spare memory cell array 121a and the row spare memory cell array 122a, respectively. An equivalent circuit representation of a fuse 33 is shown in FIG. 3, but the physical representation of the banks of fuses are not shown in FIG. 1. The fuses may be laser-blown fuses, electrically-blown fuses, or fuses with another structure.

Each of the laser-blown fuse is implemented by, for example, a metallic film or polysilicon film, which works as a fuse; and it is programmed to replace defective circuit portions thereof with the spare memory cell arrays 121a and 122a by laser ablation so that those defective circuit portions can be relieved. The fuse is programmed after a probe test. A bonding pad and an opening exposing the fuse are formed at this stage on a passivation film, which is formed on the surface of a wafer, where the probe test is performed using the bonding pad, for example. When the probe test ascertains a location of a defect, the fuse located to corresponding defective portion is fusion-cut by evaporation through application of selective laser light so that the defective portion can be replaced with a relief circuit, or it is programmed.

For the electrically-blown fuse, a programmable anti-fuse, which can be programmed through a dielectric breakdown of an insulating oxide film, may be adopted. More specifically, a capacitor encompassing an oxide film on a p-well region and a plate electrode on the oxide film for the electrically-blown fuse, in which a well electrode is formed in the p-well region. When a negative voltage is applied to the well electrode of the capacitor and a positive voltage is applied to the plate electrode on the oxide film at the same time so that the oxide film establish a dielectric breakdown, which allows programming for replacing defective circuit portions with the spare memory cell arrays 121a and 122a and relieving them.

The upper side memory cell array 12b includes a column spare memory cell array 121b and a row spare memory cell array 122b. The column spare memory cell array 121b can replace a predetermined number of columns of memory cells in the memory cell array 12b. The row spare memory cell array 122b can also similarly replace a predetermined number of rows of memory cells in the memory cell array 12b. The holding circuits 15b(i−1), 15b(i), 15b(i+1), . . . include banks of fuses corresponding to the column spare memory cell array 121b and the row spare memory cell array 122b, respectively.

Similarly, the lower side memory cell array 12c includes a column spare memory cell array 121c and a row spare memory cell array 122c, and the lower side memory cell array 12d includes a column spare memory cell array 121d and a row spare memory cell array 122d. The holding circuits 15c(i−1), 15c(i), 15c(i+1), . . . include banks of fuses corresponding to the column spare memory cell array 121c and the row spare memory cell array 122c, respectively, and the holding circuits 15d(i−1), 15d(i), 15d(i+1), . . . include banks of fuses corresponding to the column spare memory cell array 121d and the row spare memory cell array 122d, respectively.

Figure 2:
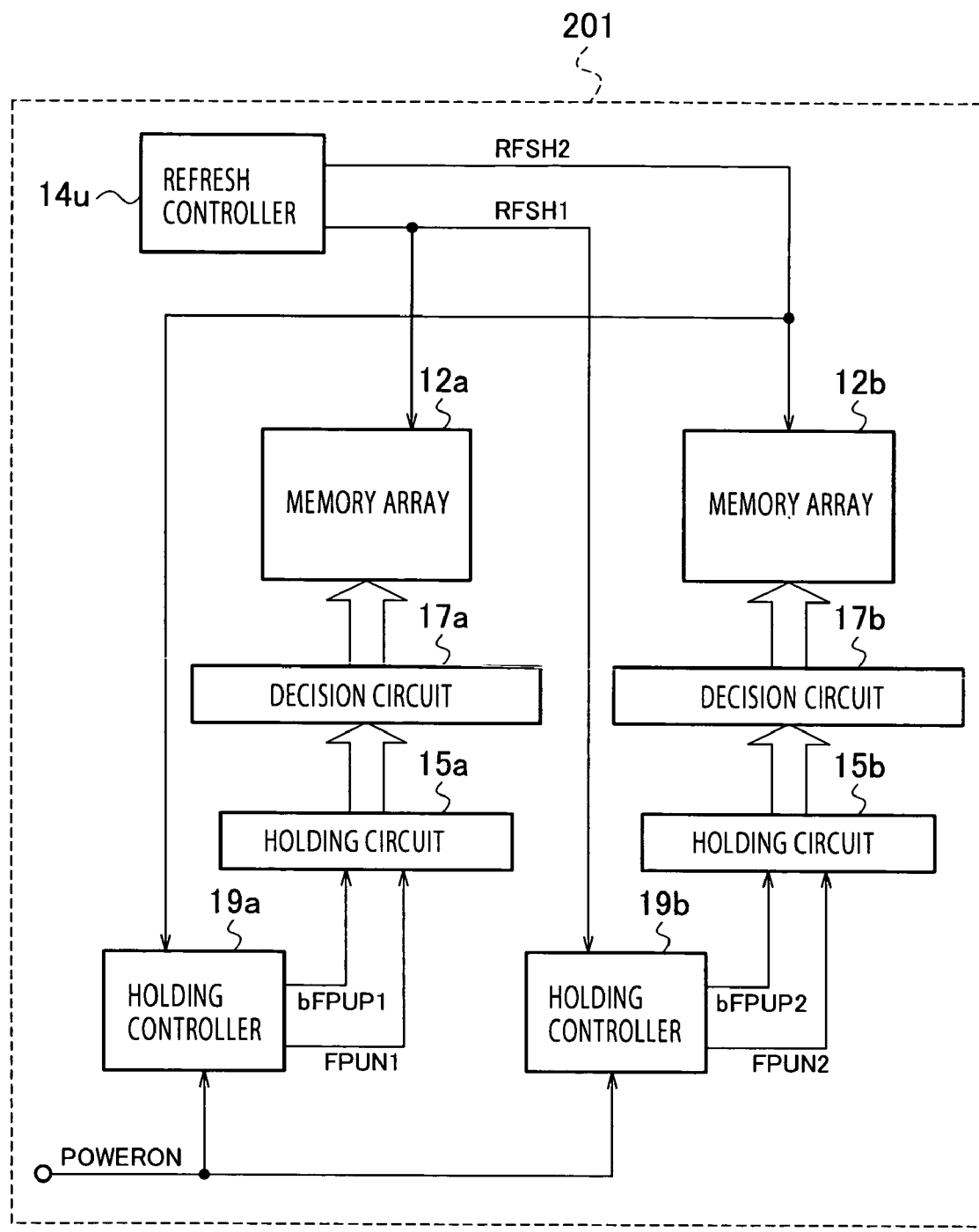
FIG. 2 is a block diagram describing the outline of the semiconductor memory according to the first embodiment of the present invention, and corresponding to a part of the plan view shown in FIG. 1.

FIG. 2 is a block diagram describing the upper side memory cell arrays 12a and 12b of FIG. 1. As shown in FIG. 2, the semiconductor memory 201 according to the first embodiment of the present invention embraces a plurality of memory cell arrays 12a and 12b; a refresh controller 14u, which delivers refresh signals to the memory cell arrays 12a and 12b; holding circuits 15a and 15b, which are provided for the memory cell arrays 12a and 12b, respectively, and read and hold fuse information; decision circuits 17a and 17b, which are provided for the memory cell arrays 12a and 12b, respectively, and determine which address of memory cell is to be replaced with which spare memory cell from spare memory cell arrays 121a, 122a and 121b, 122b, respectively, based on the fuse information from the holding circuits 15a and 15b, respectively; and holding-controllers 19a and 19b, which are provided for the memory cell arrays 12a and 12b, respectively, and control reading and holding of the fuse information in the holding circuits 15a and 15b by receiving a power supply completion signal and a refresh signal, which serves as a reread signal. In FIG. 2, the holding circuits 15a(i−1), 15a(i), 15a(i+1), . . . shown in FIG. 1 are generically represented by "the holding circuit 15a", and the holding circuits 15b(i−1), 15b(i), 15b(i+1), . . . are generically represented by "the holding circuit 15b". The same configuration applies to the lower side memory cell arrays 12c and 12d of FIG. 1, and duplicate descriptions are omitted.

The refresh controller 14u provides refresh signal RFSH1 as the reread signal to the memory cell array 12a and the holding-controller 19b at specified intervals.

As the holding-controller 19b, the holding circuit 15b, the decision circuit 17b, and the memory cell array 12b have the same structures as the holding-controller 19a, the holding circuit 15a, the decision circuit 17a, and the memory cell array 12a, respectively, overlapping or redundant description may be omitted hereafter.

With the semiconductor memory 201 having the above-given configuration, to begin with, a power supply completion signal POWERON, which is for notifying that an internal potential has been set once power is supplied to the semiconductor memory 201, is transferred to the holding-controller 19a.

The holding-controller 19a provides an initialization signal bFPUP1 of the fuse information to the holding circuit 15a when the power supply completion signal POWERON is transferred, and provides a determination signal FPUN1 of the fuse information to that holding circuit 15a once a specified period has passed.

The holding circuit 15a initializes fuse information using the initialization signal bFPUP1, reads the fuse information using the determination signal FPUN1, and continues to hold that fuse information thereafter.

The decision circuit 17a determines which address of memory cell is to be replaced with which spare memory cell from within the spare memory cell arrays 121a and 122a based on the fuse information from the holding cell 15a every time a memory cell is accessed. Accordingly, a defective memory cell in the memory cell array 12a is replaced with a spare memory cell from within the spare memory cell arrays 121a and 122a so as to serve as a normal memory cell.

Next, since the holding-controller 19a provides the initialization signal bFPUP1 and the determination signal FPUN1 to the holding circuit 15a each time a reread signal (refresh signal) RFSH2 is transferred, the holding circuit 15a repeats rereading and holding fuse information.

Accordingly, it is possible to read the fuse information one time when power is supplied, and then reread the fuse information using a refresh signal.

Next, specific circuits and operations representing the holding circuit 15a and the holding-controller 19a are described in detail.

To begin with, the holding circuit 15a is described. As shown in FIG. 3, the holding circuit 15a encompasses, for example, a p-MOSFET 31; an n-MOSFET 32, which has a drain electrode serially connected to the source electrode of the p-MOSFET 31; a fuse 33, which is serially connected between the source electrode of the n-MOSFET32 and a power supply Vss; a first inverter (detecting inverter) 35, which has an input terminal connected to a node 34 connecting the p-MOSFET 31 and the n-MOSFET 32; a second inverter (output stage inverter) 36, which has an input terminal connected to the output terminal of the first inverter (detecting inverter) 35; a third inverter (detected-information-feedback inverter) 37, which also has an input terminal connected to the output terminal of the first inverter (detecting inverter); and an n-MOSFET 38, which operates as a switch for activating/deactivating the third inverter (detected-information-feedback inverter) 37.

The output terminal of the third inverter (detected-information-feedback inverter) 37 is connected to the node 34; and the n-MOSFET 38 operating as a switch is serially connected between the source electrode of the p-MOSFET 39 and the drain electrode of the n-MOSFET 40, which implement the third inverter (detected-information-feedback inverter) 37, and has an input terminal connected to the gate electrode of the p-MOSFET 31.

In addition, the initialization signal bFPUP1 is transferred to the gate electrode of the p-MOSFET 31, and the determination signal FPUN1 is transferred to the gate electrode of the n-MOSFET 32.

Furthermore, with the first inverter (detecting inverter) 35, when the output logic level thereof is "High", a fuse conduction information signal INTACT indicating that the fuse is in a conductive state is transferred; and with the second inverter (output stage inverter) 36, when the output thereof is "High", a fuse disconnection information signal BROWN indicating that the fuse is in a disconnected state is transferred.

Figure 4:
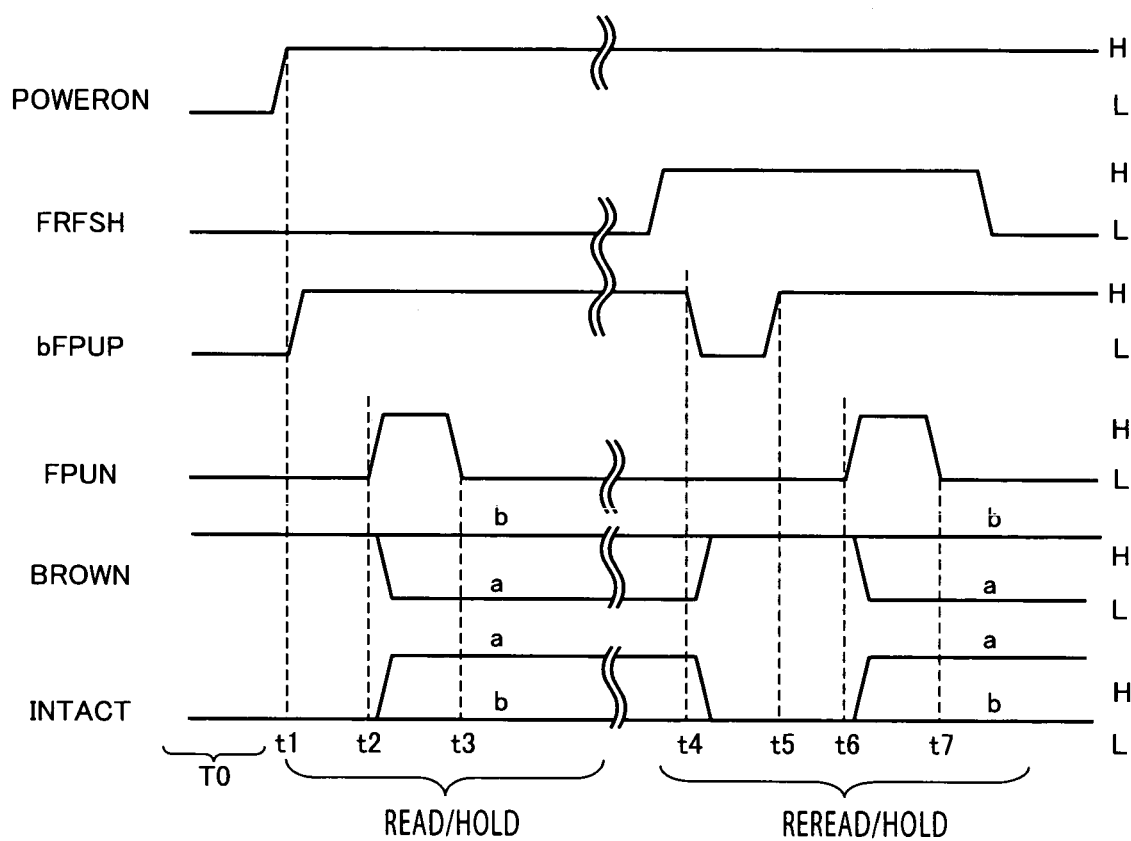
FIG. 4 is a timing chart showing an operation of the holding circuit of the semiconductor memory according to the first embodiment of the present invention.

(a) As shown in FIG. 4, once power is supplied to the semiconductor memory 201, since the initialization signal bFPUP1 and the determination signal FPUN1 are both "Low" within time T0, which continues until the power supply completion signal POWERON notifying that an internal potential has been set reaches "High", the p-MOSFET 31 is on, the n-MOSFET 32 is off, and the initial value of the node 34 is "High".

(b) Next, at t1 when the power supply completion signal POWERON becomes "High", the initialization signal bFPUP1 is set to "High" by the holding-controller 19a, thereby turning off the p-MOSFET 31; however, since the n-MOSFET 38 operating as a switch due to the initialization signal bFPUP1 having been set to "High" turns on, the conduction between the source electrode of the p-MOSFET 39 and the drain electrode of the n-MOSFET 40 in the third inverter (detected-information-feedback inverter) 37 is established. Accordingly, the third inverter (detected-information-feedback inverter) 37 is activated so that the p-MOSFET 39 turns on and the n-MOSFET 40 turns off, and the initial value "High" of the node 34 is maintained.

(c) Next, as indicated at t2 after a specified period of time has passed, the holding-controller 19a feeds a determination signal FPUN1 of "High", thereby turning on the n-MOSFET 32. In this case, when the fuse 33 is conducting, the node 34 is set to "Low", and therefore the first inverter (detecting inverter) 35 transfers a fuse conduction information signal INTACT of "High", and the second inverter (output stage inverter) 36 transfers a fuse disconnection information signal BROWN of "Low". As a result, information of the fuse 33 being in a conductive state is sent to the decision circuit 17a, and further, the "Low" state of the node 34 is maintained by the activated third inverter (detected-information-feedback inverter) 37. On the other hand, when the fuse 33 has been disconnected, the initial state "High" of the node 34 is maintained, and therefore the first inverter (detecting inverter) 35 continues to provide a fuse conduction information signal INTACT of "Low", and the second inverter (output stage inverter) 36 continues to provide a fuse disconnection information signal BROWN of "High". As a result, information of the fuse 33 being in a disconnected state is sent to the decision circuit 17a, and further, the "High" state of the node 34 is maintained by the activated third inverter (detected-information-feedback inverter) 37.

(d) Next, at t3 when the holding-controller 19a feeds a determination signal FPUN1 of "Low", the n-MOSFET 32 is turned off; however, since the third inverter (detected-information-feedback inverter) 37 continues to be activated, the state of the node 34 continues to be maintained.

(e) When rereading and holding the fuse information, at t4, bFPUP is activated ("Low") and the initializing p-MOSFET 31 is activated, thereby making the holding node 34 enter an initialized state ("High"). Consequently, the fuse disconnection information signal BROWN is activated ("High"), the fuse conduction information signal INTACT is deactivated ("Low"), and information of the fuse being in a disconnected state is sent.

(f) Next, once bFPUP is deactivated ("High") at t5 and a specified period of time has passed, at t6, the n-MOSFET 32 turns on when the holding-controller 19a feeds a determination signal FPUN1 of "High". In this case, when the fuse 33 is conducting, the node 34 is set to "Low", and therefore the first inverter (detecting inverter) 35 transfers a fuse conduction information signal INTACT of "High", and the second inverter (output stage inverter) 36 transfers a fuse disconnection information signal BROWN of "Low". As a result, information of the fuse 33 being in a conductive state is sent to the decision circuit 17a, and further, the "Low" state of the node 34 is maintained by the activated third inverter (detected-information-feedback inverter) 37. On the other hand, when the fuse 33 is disconnected, the initial state "High" of the node 34 is maintained, and therefore the first inverter (detecting inverter) 35 continues to provide a fuse conduction information signal INTACT of "Low", and the second inverter (output stage inverter) 36 continues to provide a fuse disconnection information signal BROWN of "High". As a result, information of the fuse 33 being in a disconnected state is sent to the decision circuit 17a, and further, the "High" state of the node 34 is maintained by the activated third inverter (detected-information-feedback inverter) 37.

(g) Next, at t7 when the holding-controller 19a feeds a determination signal FPUN of "Low", the n-MOSFET 32 is turned off; however, since the third inverter (detected-information-feedback inverter) 37 continues to be activated, the state of the node 34 may continue to be maintained. In this manner, at times t4 to t7, fuse information is reread and held.

Attention should be given to the fact that when fuse information is being reread, the holding circuit 15a sends information of the fuse being in a disconnected state. In other words, before correct fuse information obtained by rereading the fuse information is sent, the fuse disconnection information signal BROWN is always activated ("High"), the fuse conduction information signal INTACT is deactivated ("Low"), and information of the fuse being in a disconnected state is sent.

Accordingly, the holding circuit 15a can reread and hold fuse information only when other operations are not affected even if the holding circuit 15a sends information of the fuse being in a disconnected state along with rereading the fuse information.

With the first embodiment, this problem can be avoided by rereading and holding the fuse information of the fuse, which is used for replacement with the spare memory cell arrays 121a and 122a, at the time when the memory cell array 12a corresponding to that fuse is in an idling state, or in a period outside of refresh period.

Figure 5:
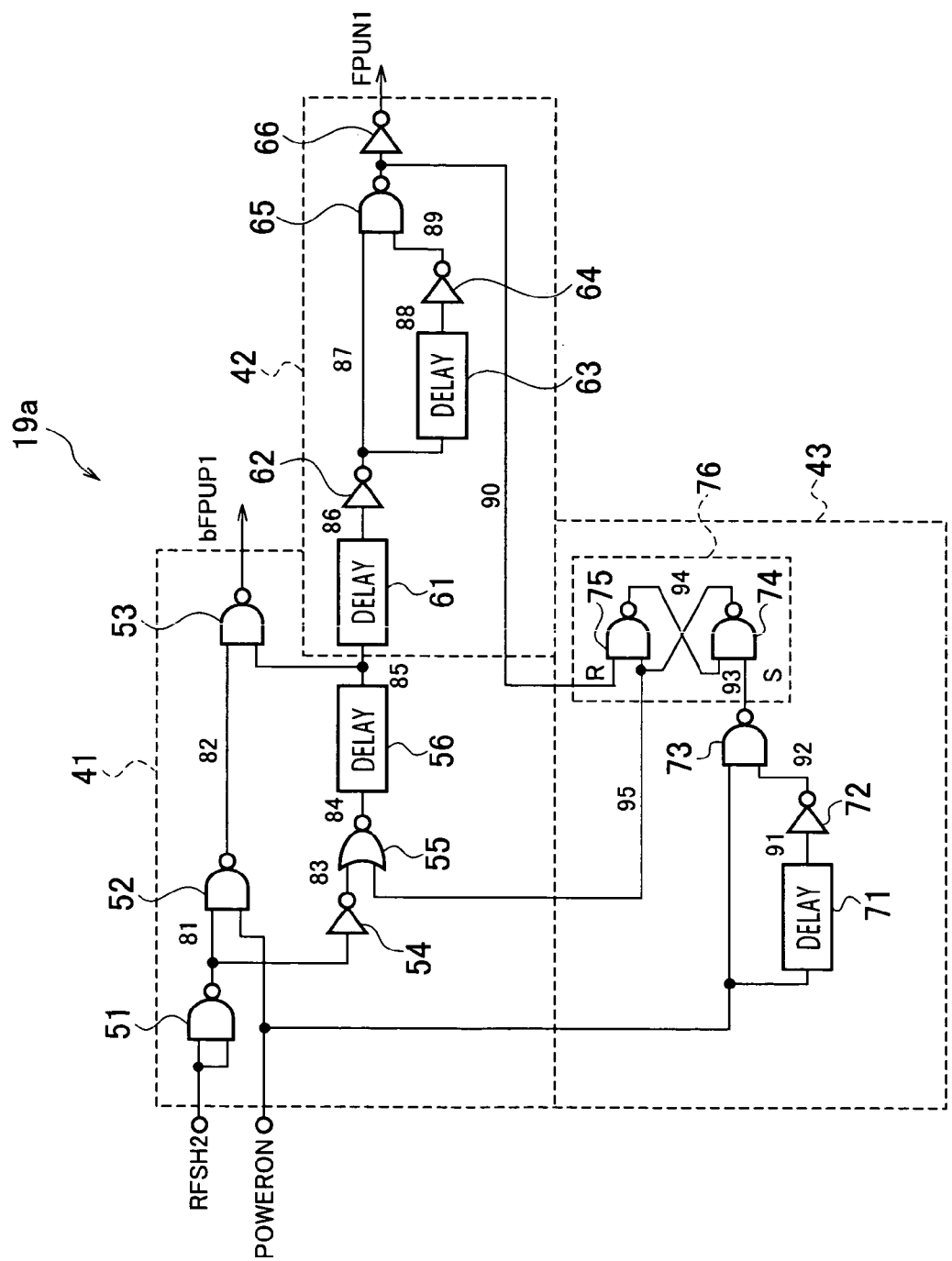
FIG. 5 is a diagram showing a holding-controller of the semiconductor memory according to the first embodiment of the present invention.

Next, the holding-controller 19a is described. As shown in FIG. 5, broadly classified, the holding-controller 19a encompasses an initialization signal generation unit 41, which generates an initialization signal bFPUP1, a determination signal generation unit 42, which generates a determination signal FPUN1, and a synchronizing unit 43, which synchronizes the initialization signal generation unit 41 and the determination signal generation unit 42; wherein each unit embraces a group of a predetermined number of circuits necessary for the fuse information.

The initialization signal generation unit 41 encompasses a first NAND gate 51, which receives a refresh signal RFSH2 as a reread signal from the refresh controller 14u, a second NAND gate 52, which receives the output from the first NAND gate 51 and a power supply completion signal POWERON, and a NAND gate 53, which accepts a delay signal that delays the output of the first NAND gate 51 through a series circuit made up of an inverter 54, a NOR gate 55, and a delay circuit 56, and feeds an initialization signal.

The determination signal generation unit 42 encompasses: a series circuit made up of a delay circuit 61, which further delays the delayed signal from the delay circuit 56 in the initialization signal generation unit 41, and an inverter 62; a series circuit made up of a delay circuit 63, which further delays the output of the inverter 62, and an inverter 62; a NAND gate 65, which generates "Low" by inputting the output of the inverter 62 and the output of the inverter 64 that delayed that output of the inverter 62; and an inverter 66, which delivers a determination signal resulting from inverting the output of the NAND gate 65.

The synchronizing unit 43 encompasses: a series circuit made up of a delay circuit 71 that delays the power supply completion signal POWERON and an inverter 72; a NAND gate 73, which accepts the power supply completion signal POWERON and the output of the inverter 72 that delays the power supply completion signal POWERON and then provides "Low"; and a flip-flop circuit 76, which includes NAND gates 74 and 75.

This flip-flop circuit 76 has an "Low" signal generated from the NAND gate 73 as a set signal and an "Low" signal generated from the NAND gate 65 as a reset signal, and feeds to the NOR gate 55 of the initialization signal generation unit 41.

Figure 6:
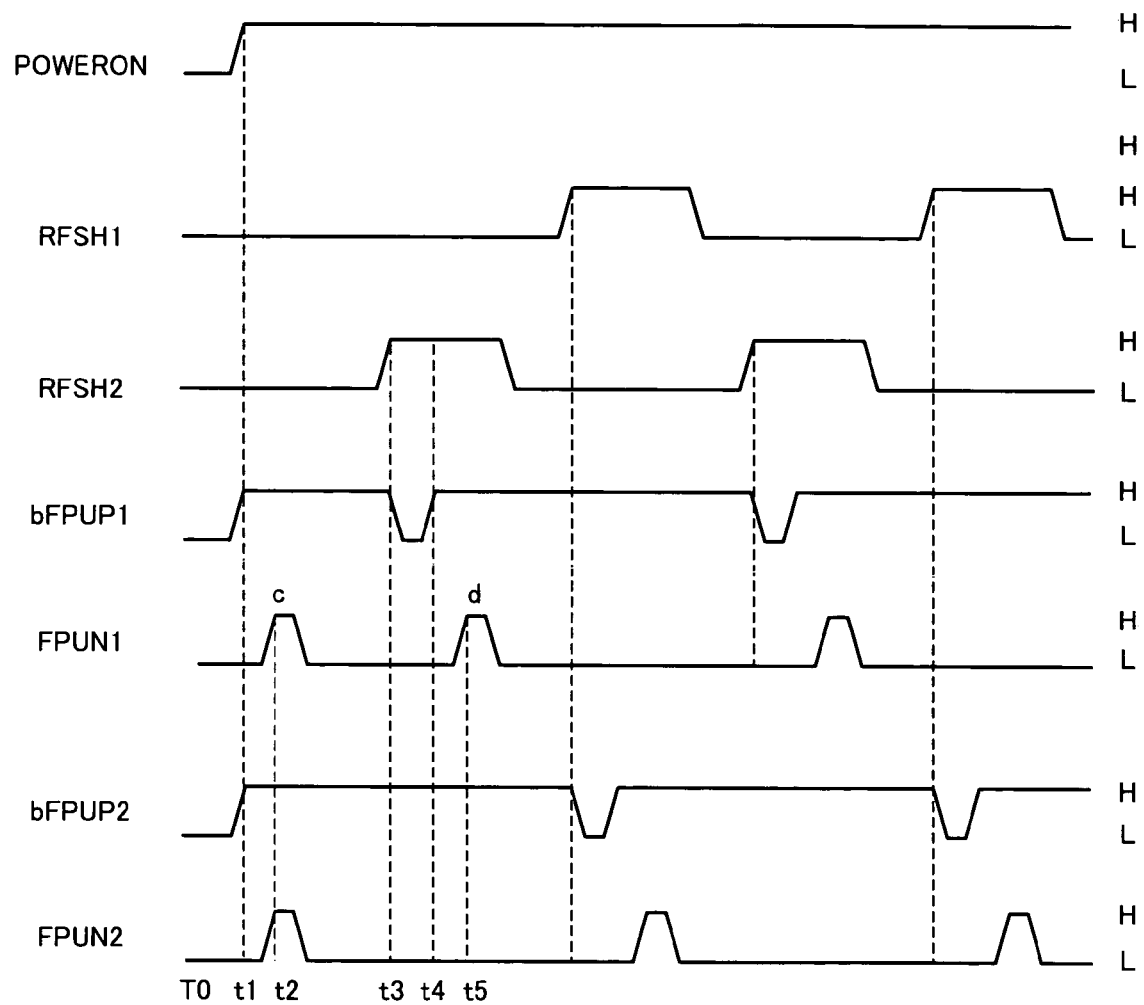
FIG. 6 is a timing chart showing an operation of the holding-controller of the semiconductor memory according to the first embodiment of the present invention.

(a) As shown in FIG. 6, once power is supplied (T0), both the power supply completion signal POWERON and the reread signal (refresh signal) RFSH2 become "Low". Furthermore, the flip-flop circuit 76 enters a reset state and the node 95 becomes "Low". In addition, since the reread signal (refresh signal) RFSH2 is "Low", a node 81 is set to "High" by the first NAND gate 51, and since the power supply completion signal POWERON is "Low", a node 82 is set to "High" by the second NAND gate 52. Since the inverter 54 provides "Low" to a node 83 and the node 95 is "Low", the NOR gate 55 provides "High" to a node 84, and via the delay circuit 56, a node 85 is set to "High". As a result, the initialization signal bFPUP1 is initially set to "Low" by the NAND gate 53. Next, since a node 86 is set to "High" via the delay circuit 61, a node 87 is set to "Low" by the inverter 62, a low pulse generation circuit, which encompasses the NAND gate 65, enters a reset state, and a node 90 is set to "High". As a result, the determination signal FPUN1 is initially set to "Low" by the inverter 66.

(b) Next, at t1 when the power supply completion signal POWERON becomes "High", the node 82 is set to "Low" by the second NAND gate 52. As a result, the initialization signal bFPUP1 is set to "High" by the NAND gate 53. In addition, since a low pulse generation circuit, which encompasses the delay circuit 71, the inverter 72, and the NAND gate 73, is activated, generating "Low" at the node 93, the flip-flop circuit 76 is set so that the node 96 is set to "High", the node 84 is set to "Low" by the NOR gate 55, and the node 85 also is set to "Low" via the delay circuit 56. Further, the node 86 is set to "Low" via the delay circuit 61, the node 87 is set to "High" by the inverter 62, and a low pulse generation circuit, which encompasses the delay circuit 63, the inverter 64, and the NAND gate 65, is activated, generating "Low" at the node 90. As a result, at t2 after t1, the inverter 66 feeds a determination signal FPUN1 of "High". Accordingly, the holding-controller 19a can output the initialization signal bFPUP1 and the determination signal FPUN1 to the holding circuit 15a, as shown in FIG. 4. In addition, since the flip-flop circuit 76 is reset so that the node 95 is set to "Low", the node 84 returns to being "High" by the NOR gate 55, the node 85 returns to "High" via the delay circuit 56, and the node 86 returns to "High" via the delay circuit 61. As a result, the node is set to "Low" by the inverter 66, and the low pulse generation circuit encompassing the delay circuit 63, the inverter 64, and the NAND gate 65 is reset.

(c) Next, at t3 when the reread signal (refresh signal) RFSH2 is set to "High" after the power supply completion signal POWERON has become "High", the node 82 is set to "High" by the second NAND gate 52 since the node 81 is set to "Low" by the first NAND gate 51. As a result, since the node 85 is "High", the initialization signal bFPUP1 is reset to "Low" by the NAND gate 53.

(d) Subsequently, at t4, the node 85 becomes "Low" due to delay by the inverter 54, the NOR gate 55, and the delay circuit 56. As a result, the initialization signal bFPUP1 is reset to "High" by the NAND gate 53.

(e) Next, at t5, since the node 86 becomes "Low" via the delay circuit 61, and the node 87 becomes "High" by the inverter 62, the low pulse generation circuit, which encompasses the delay circuit 63, the inverter 64, and the NAND gate 65, is activated, generating "Low" at the node 90. As a result, a determination signal FPUN1 of "High" is transferred again by the inverter 66.

Accordingly, every time the reread signal (refresh signal) is set to "High", the holding-controller 19a can once again deliver the initialization signal bFPUP1 and the determination signal FPUN1 to the holding circuit 15a. As a result, the holding circuit 15a rereads and holds the fuse information, and can deliver again the fuse conduction information signal INTACT and the fuse disconnection information signal BROWN to the decision circuit 17a.

As described above, with the semiconductor memory according to the first embodiment, since the fuse information is read by the holding circuit 15a once power is supplied, and the fuse information is then reread by the holding circuit 15a every time the reread signal (refresh signal) RFSH2 is transferred, even if the held fuse information is erroneous, it can be corrected again and again without re-supplying power. Accordingly, since a system with which re-supplying power is difficult can be operated with stability over a long period of time, a highly reliable system can be constructed.

(Second Embodiment)

Figure 7:
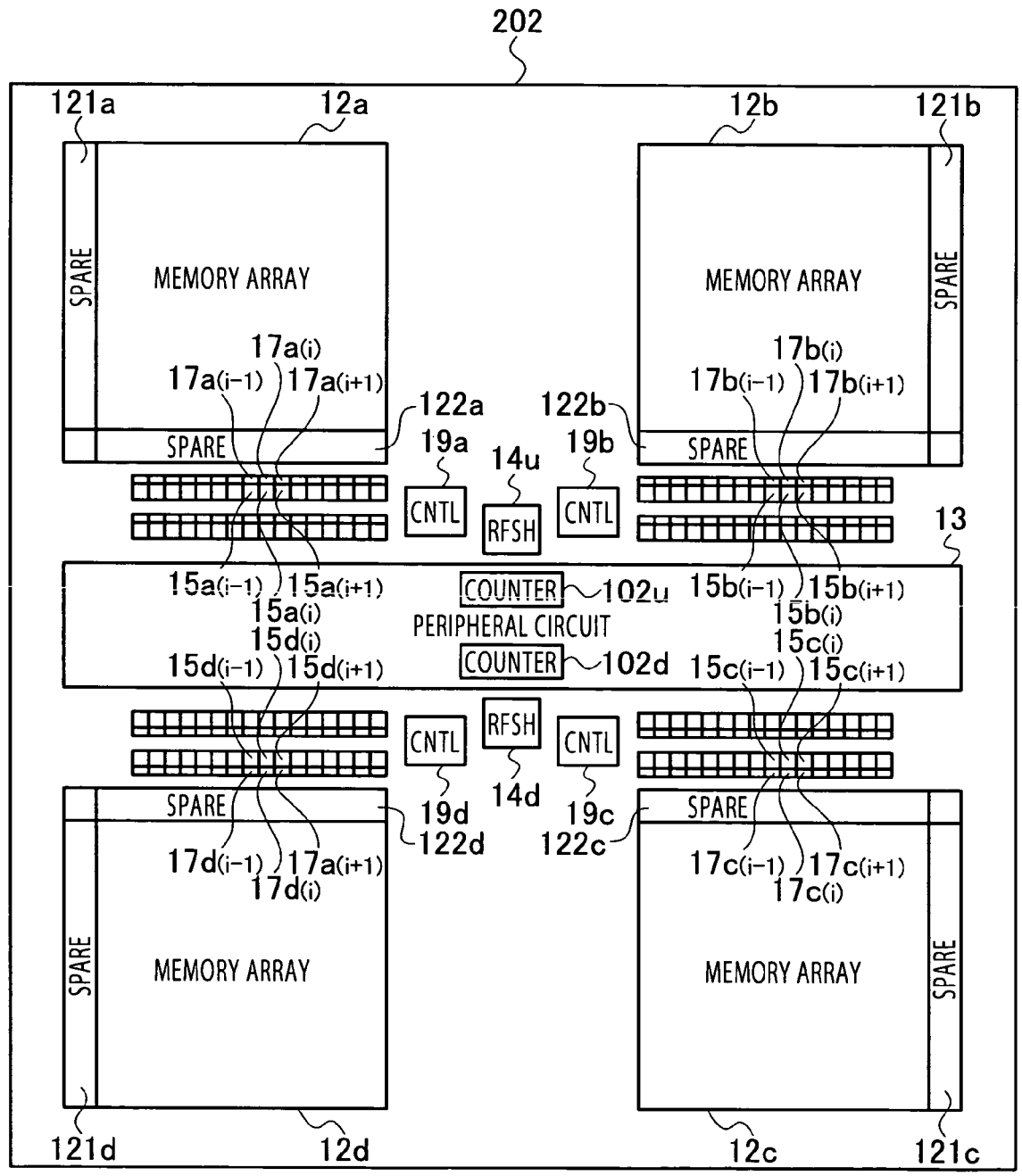
FIG. 7 is a plan view showing a schematic layout on a semiconductor chip of a semiconductor memory according to the second embodiment of the present invention.

As shown in FIG. 7, a semiconductor memory 202 according to a second embodiment of the present invention embraces a plurality of memory cell arrays 12a, 12b, 12c, and 12d; refresh controllers 14u and 14d, which deliver refresh signals to the memory cell arrays 12a, 12b, 12c, and 12d as reread signals; holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , configured to read and hold fuse information; decision circuits 17a(i−1), 17a(i), 17a(i+1), . . . , 17b(i−1), 17b(i), 17b(i+1), . . . , 17c(i−1), 17c(i), 17c(i+1), 17d(i−1), 17d(i), 17d(i+1), . . . , configured to determine which address of memory cell is to be replaced with which spare memory cell based on the fuse information from the holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , respectively; holding-controllers 19a, 19b, 19c, and 19d, configured to control reading and holding of the fuse information in the holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , by receiving a power supply completion signal and a reread signal (refresh signal); and counters 102u and 102d.

The holding circuits 15a(i−1), 15a(i), 15a(i+1), . . . , 15b(i−1), 15b(i), 15b(i+1), . . . , 15c(i−1), 15c(i), 15c(i+1), . . . , 15d(i−1), 15d(i), 15d(i+1), . . . , are provided for the memory cell arrays 12a, 12b, 12c, and 12d, respectively. The decision circuits 17a(i−1), 17a(i), 17a(i+1), . . . , 17b(i−1), 17b(i), 17b(i+1), . . . , 17c(i−1), 17c(i), 17c(i+1), . . . , 17d(i−1), 17d(i), 17d(i+1), . . . , are provided for the memory cell arrays 12a, 12b, 12c and 12d, respectively. The holding-controllers 19a, 19b, 19c, and 19d, are provided for the memory cell arrays 12a, 12b, 12c, and 12d, respectively.

The counters 102u and 102d count reread signals (refresh signals) and provides a most significant bit output signal CARRY, which serves as a second reread signal for rereading the fuse information. In other words, the difference of the semiconductor memory 202 according to the second embodiment of the present invention from the semiconductor memory 201 according to the first embodiment of the present invention is incorporation of the counters 102u and 102d that count refresh signals as first reread signals.

In FIG. 7, a peripheral circuit 13 is located in the central region of the semiconductor memory 202, namely between the memory cell arrays 12a and 12b arranged in the upper section and the memory cell arrays 12c and 12d arranged in the lower section, and the counters 102u and 102d are located in this peripheral circuit 13 area. The upper counter 102u counts refresh signals from the upper refresh controller 14u, and feeds to the holding-controllers 19a and 19b the most significant bit output signal CARRY from the counter 102u as a second reread signal. The lower counter 102d counts refresh signals from the lower refresh controller 14d, and feeds to the holding-controllers 19c and 19d the most significant bit output signal CARRY from the counter 102d as a second reread signal.

However, the configuration of FIG. 7 is merely an example; a configuration allowing a single counter to count refresh signals from the upper refresh controller 14u and the lower refresh controller 14d, and output the most significant bit output signal CARRY to the holding-controllers 19a, 19b, 19c and 19d is possible. Furthermore, the positions of the counters 102u and 102d are not limited to the position of the peripheral circuit 13 as in FIG. 7, and may be arranged at other positions. Furthermore, the configuration having the upper refresh controller 14u and the lower refresh controller 14d shown in FIG. 7 is an example, and another configuration having a single refresh controller configured to deliver refresh signals to the memory cell arrays 12a, 12b, 12c, and 12d as reread signals can be employed.

As with the semiconductor memory according to the first embodiment of the present invention, the upper side memory cell array 12a includes a column spare memory cell array 121a and a row spare memory cell array 122a. The holding circuits 15a(i−1), 15a(i), 15a(i+1), . . . include banks of fuses corresponding to the column spare memory cell array 121a and the row spare memory cell array 122a, respectively. The upper side memory cell array 12b includes a column spare memory cell array 121b and a row spare memory cell array 122b. The holding circuits 15b(i−1), 15b(i), 15b(i+1), . . . include banks of fuses corresponding to the column spare memory cell array 121b and the row spare memory cell array 122b, respectively. Similarly, the lower side memory cell array 12c includes a column spare memory cell array 121c and a row spare memory cell array 122c, and the lower side memory cell array 12d includes a column spare memory cell array 121d and a row spare memory cell array 122d. The holding circuits 15c(i−1), 15c(i), 15c(i+1), . . . include banks of fuses corresponding to the column spare memory cell array 121c and the row spare memory cell array 122c, respectively, and the holding circuits 15d(i−1), 15d(i), 15d(i+1), . . . include banks of fuses corresponding to the column spare memory cell array 121d and the row spare memory cell array 122d, respectively.

Figure 8:
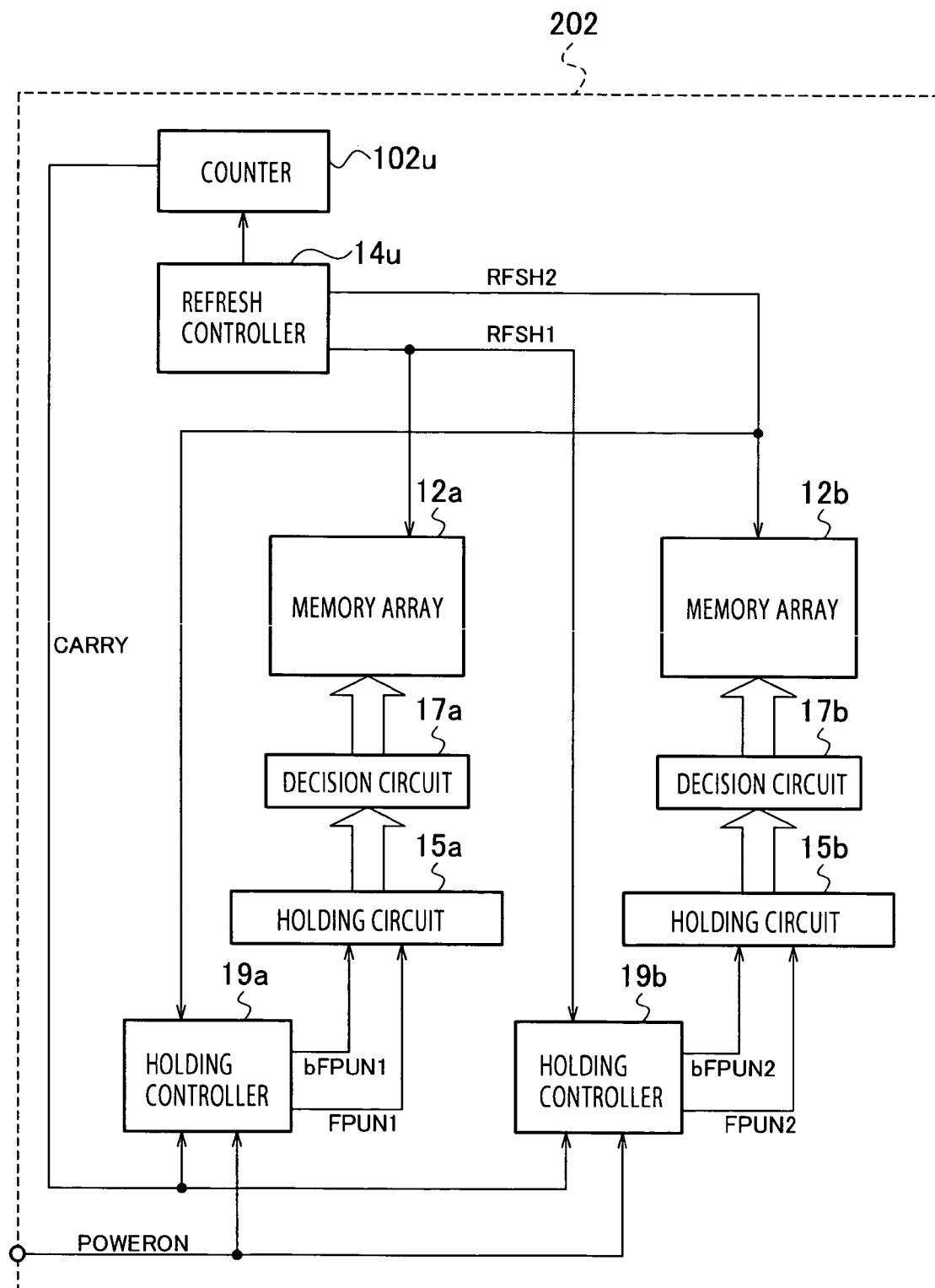
FIG. 8 is a block diagram describing the outline of the semiconductor memory according to the second embodiment of the present invention, and corresponding to a part of the plan view shown in FIG. 7.

FIG. 8 is a block diagram describing the upper side memory cell arrays 12a and 12b of FIG. 7. In FIG. 8, the holding circuits 15a(i−1), 15a(i), 15a(i+1), . . . shown in FIG. 7 are generically represented by the holding circuit 15a, and the holding circuits 15b(i−1), 15b(i), 15b(i+1), . . . are generically represented by the holding circuit 15b. As described using FIG. 7, what is different from the semiconductor memory according to the first embodiment is that the counter 102u counts refresh signals (first reread signals) from the refresh controller 14u, and feeds to the holding-controllers 19a and 19b the most significant bit output signal CARRY from the counter 102u as a second reread signal. The same configuration applies to the lower side memory cell arrays 12c and 12d FIG. 7, and duplicate descriptions are omitted.

Figure 9:
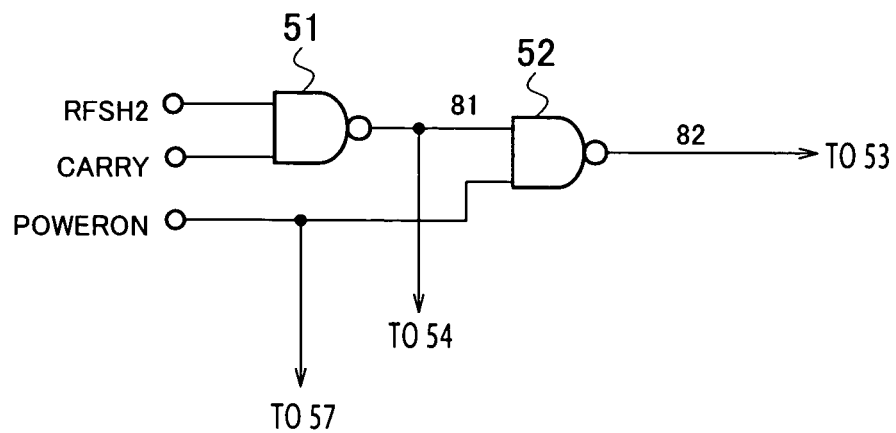
FIG. 9 is a diagram showing significant parts of a holding-controller of the semiconductor memory according to the second embodiment of the present invention.
Figure 10:
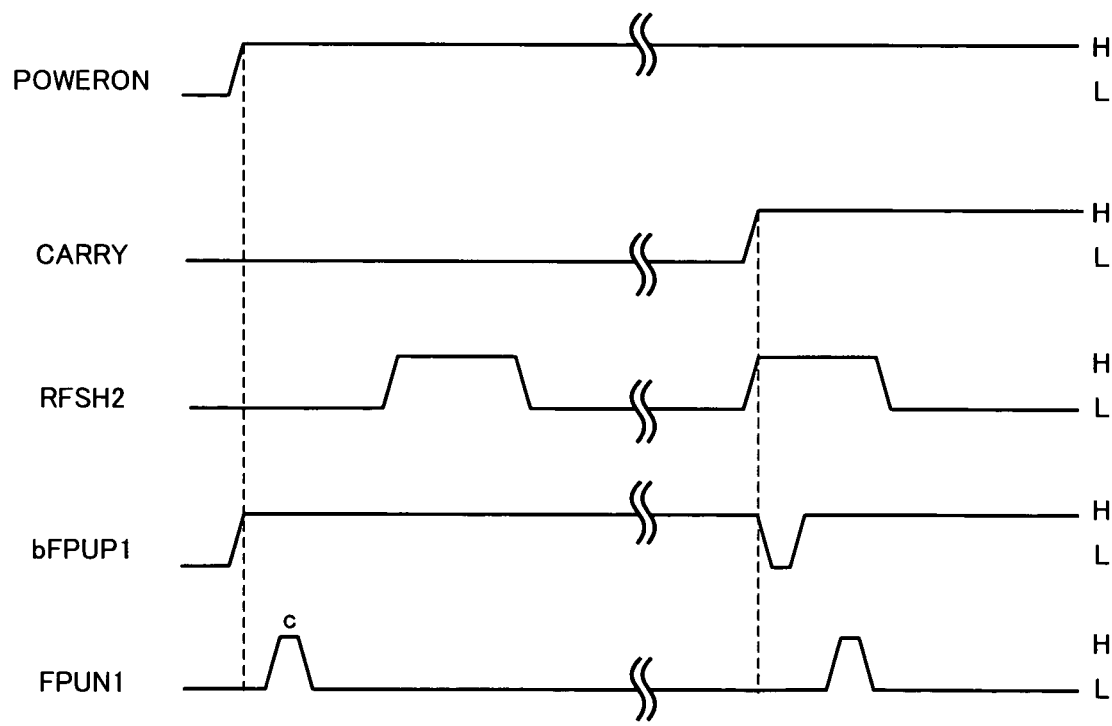
FIG. 10 is a timing chart showing an operation of the holding-controller of the semiconductor memory according to the second embodiment of the present invention.

FIG. 9 is a diagram showing the circuit portion of the holding-controller 19a of FIG. 5 to which a counter signal CARRY is transferred; and FIG. 10 is a timing chart showing an operation of that holding-controller.

As shown in FIG. 9, a first reread signal (refresh signal) RFSH2 of the refresh controller 14$u$ is transferred to one of input terminals of the first NAND gate 51 in the holding-controller of FIG. 5, and a second reread signal (refresh signal) CARRY of the counter 102$u$ is transferred to the other input terminal. Accordingly, when both the first reread signal (refresh signal) RFSH2 and the second reread signal (refresh signal) CARRY are "High", the node 81 is set to "Low" by the first NAND gate 51.

(a) In other words, as shown in FIG. 10, immediately after power is supplied, the power supply completion signal POWERON, the first reread signal (refresh signal) RFSH2 and the second reread signal (refresh signal) CARRY are "Low".

(b) Once the power supply completion signal POWERON has become "High", the counter 102$u$ begins to count the first reread signals (refresh signals) RFSH2, and since the most significant bit output signal CARRY of the counter 102$u$ is set to "High" when reaching a full count, the initialization signal bFPUP1 and the determination signal FPUN1 can be fed again to the holding circuit 15$a$ when the first reread signals (refresh signals) RFSH2 are "High".

(c) Once the fuse information is reread using the second reread signals (counter signals) CARRY, the second reread signals (counter signals) CARRY are reset, and counting of the first reread signals (refresh signals) RFSH2 starts again. As a result, rereading and holding of fuse information may be repeated every time the second reread signals (refresh signals) CARRY become "High".

As described above, with the semiconductor memory 202 according to the second embodiment, fuse information can be reread using the second reread signals (counter signals) CARRY, and thus power dissipation can be controlled by reducing the rereading frequency compared to when only using the first reread signals (refresh signals) RFSH2. In addition, as with the semiconductor memory according to the first embodiment, even if erroneous fuse information is set, it can be corrected again and again without re-supplying power. Accordingly, since a system with which re-supplying power is difficult can be operated with stability over a long period of time, high reliability is obtainable.

With the semiconductor memory according to the second embodiment of the present invention, the case where the most significant bit output signal CARRY of the counter 102$u$ is used for the second reread signal; however, another bit output signal may be used instead of the most significant bit.

(Third Embodiment)

Figure 11:
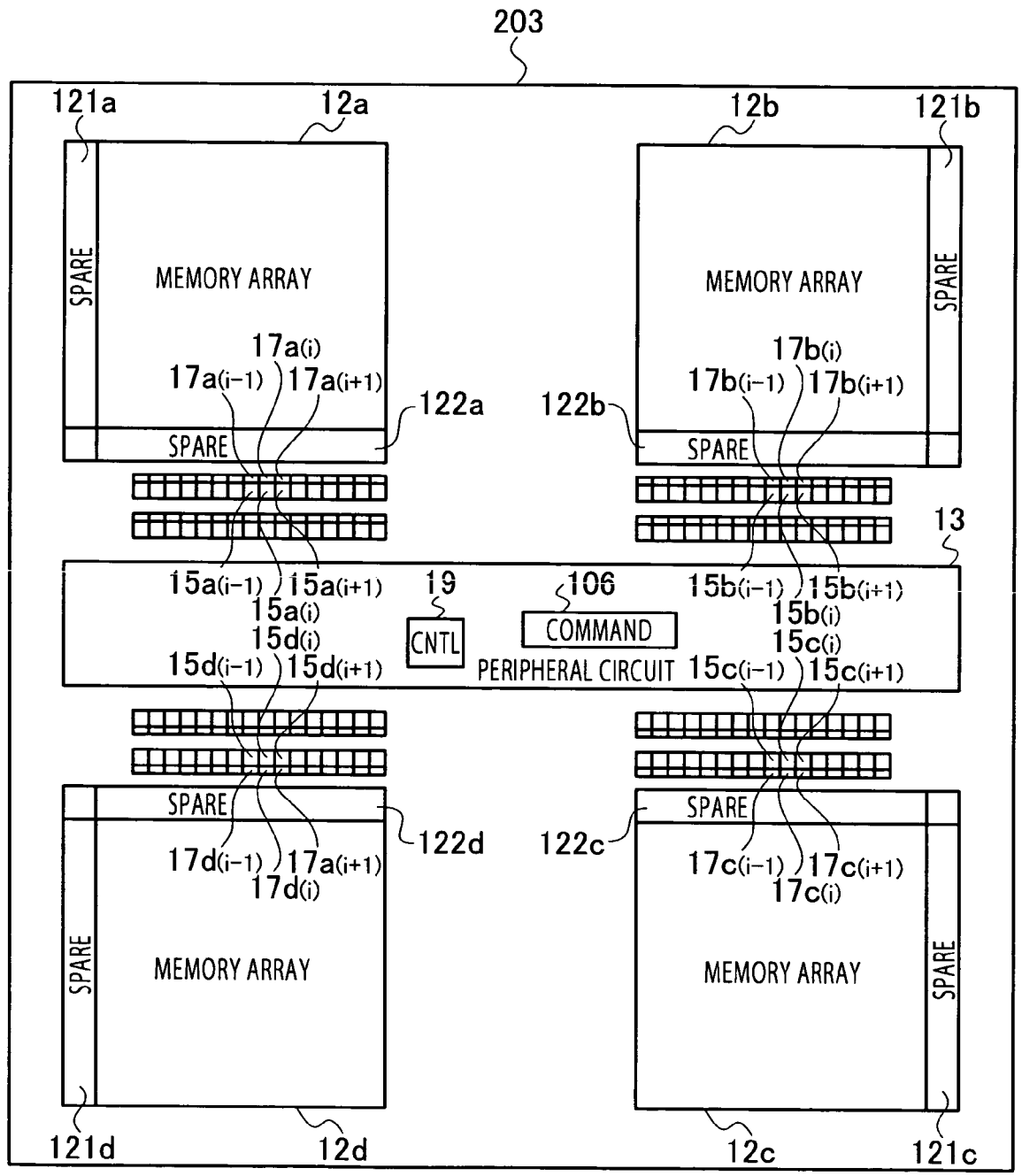
FIG. 11 is a plan view showing a schematic layout on a semiconductor chip of a semiconductor memory according to the third embodiment of the present invention.

As shown in FIG. 11, a semiconductor memory 203 according to a third embodiment of the present invention embraces a plurality of memory cell arrays 12$a$, 12$b$, 12$c$, and 12$d$; holding circuits 15$a$(i−1), 15$a$(i), 15$a$(i+1), . . . , 15$b$(i−1), 15$b$(i), 15$b$(i+1), . . . , 15$c$(i−1), 15$c$(i), 15$c$(i+1), . . . , 15$d$(i−1), 15(i), 15$d$(i+1), . . . , which are provided for the memory cell arrays 12$a$, 12$b$, 12$c$, and 12$d$, respectively, and read and hold fuse information; decision circuits 17$a$(i−1), 17$a$(i), 17$a$(i+1), . . . , 17$b$(i−1), 17$b$(i), 17$b$(i+1), . . . , 17$c$(i−1), 17$c$(i), 17$c$(i+1), . . . , 17$d$(i−1), 17$d$(i), 17$d$(i+1), . . . , which are provided for the memory cell arrays 12$a$, 12$b$, 12$c$ and 12$d$, respectively, and determine which address of memory cell is to be replaced with which spare memory cell based on the fuse information from the holding circuits 15$a$(i−1), 15$a$(i), 15$a$(i+1), . . . , 15$b$(i−1), 15$b$(i), 15$b$(i+1), . . . , 15$c$(i−1), 15$c$(i), 15$c$(i+1), . . . , 15$d$(i−1), 15$d$(i), 15$d$(i+1), . . . , respectively; a holding-controller 19, which is provided for the memory cell arrays 12$a$, 12$b$, 12$c$, and 12$d$, respectively, and control reading and holding of the fuse information from the holding circuits 15$a$(i−1), 15$a$(i), 15$a$(i+1), . . . , 15$b$(i−1), 15$b$(i), 15$b$(i+1), . . . , 15$c$(i−1), 15$c$(i), 15$a$(i+1), . . . , 15$d$(i−1), 15$d$(i), 15$d$(i+1), . . . by receiving a power supply completion signal and a reread signal (refresh signals); and a command decoder 106. The command decoder 106 converts an input command to a reread signal (control signal) and supplies the reread signal (control signal) to the holding-controller 19. In other words, once fuse information is read into the holding circuits 15$a$(i−1), 15$a$(i), 15$a$(i+1), . . . , 15$b$(i−1), 15$b$(i), 15$b$(i+1), . . . , 15$c$(i−1), 15$c$(i), 15$c$(i+1), . . . , 15$d$(i−1), 15$d$(i), 15$d$(i+1), . . . using a power supply completion signal, reading the fuse information into the 15$a$(i−1), 15$a$(i), 15$a$(i+1), . . . , 15$b$(i−1), 15$b$(i), 15$b$(i+1), . . . , 15$c$(i−1), 15$c$(i), 15$c$(i+1), . . . , 15$d$(i−1), 15$d$(i), 15$d$(i+1), . . . every time the reread signal (control signal) of the command decoder is generated is what is different from the semiconductor memory 201 according to the first embodiment of the present invention.

In FIG. 11, a peripheral circuit 13 is located in the central region of the semiconductor memory 203, namely between the upper memory cell arrays 12$a$ and 12$b$ and the lower memory cell arrays 12$c$ and 12$d$, and the command decoder 106 is located in this peripheral circuit 13 area. However, the configuration of FIG. 11 is merely an example; one command decoder 106 may be divided into an upper command decoder and a lower command decoder. Furthermore, the position of the command decoder 106 is not limited to the position of the peripheral circuit 13 as in FIG. 11, and may be arranged at another position.

As with the semiconductor memory 201 according to the first embodiment of the present invention, the memory cell array 12$a$ on the upper side includes a column spare memory cell array 121$a$ and a row spare memory cell array 122$a$. The holding circuits 15$a$(i−1), 15$a$(i), 15$a$(i+1), . . . include banks of fuses corresponding to the column spare memory cell array 121$a$ and the row spare memory cell array 122$a$, respectively. The upper side memory cell array 12$b$ includes a column spare memory cell array 121$b$ and a row spare memory cell array 122$b$. The holding circuits 15$b$(i−1), 15$b$(i), 15$b$(i+1), . . . include banks of fuses corresponding to the column spare memory cell array 121$b$ and the row spare memory cell array 122$b$, respectively. Similarly, the lower side memory cell array 12$c$ includes a column spare memory cell array 121$c$ and a row spare memory cell array 122$c$, and the lower side memory cell array 12$d$ includes a column spare memory cell array 121$d$ and a row spare memory cell array 122$d$. The holding circuits 15$c$(i−1), 15$c$(i), 15$c$(i+1), . . . include banks of fuses corresponding to the column spare memory cell array 121$c$ and the row spare memory cell array 122$c$, respectively, and the holding circuits 15$d$(i−1), 15$d$(i), 15$d$(i+1), . . . include banks of fuses corresponding to the column spare memory cell array 121$d$ and the row spare memory cell array 122$d$, respectively.

The difference of the semiconductor memory according to the third embodiment of the present invention from the semiconductor memory according to the first embodiment of the present invention is that by including the command decoder 106, a reread signal is transferred when the memory cell arrays 12$a$, 12$b$, 12$c$ and 12$d$ in a semiconductor memory, or particularly dynamic random access memory (DRAM), are in an idling state, and the fuse information is then reread. The case of the memory cell arrays 12$a$, 12$b$, 12$c$ and 12$d$ entering an idling state includes a case of setting a pre-charge power down mode, for example, or a case of setting an operating mode to a mode register.

Figure 12:
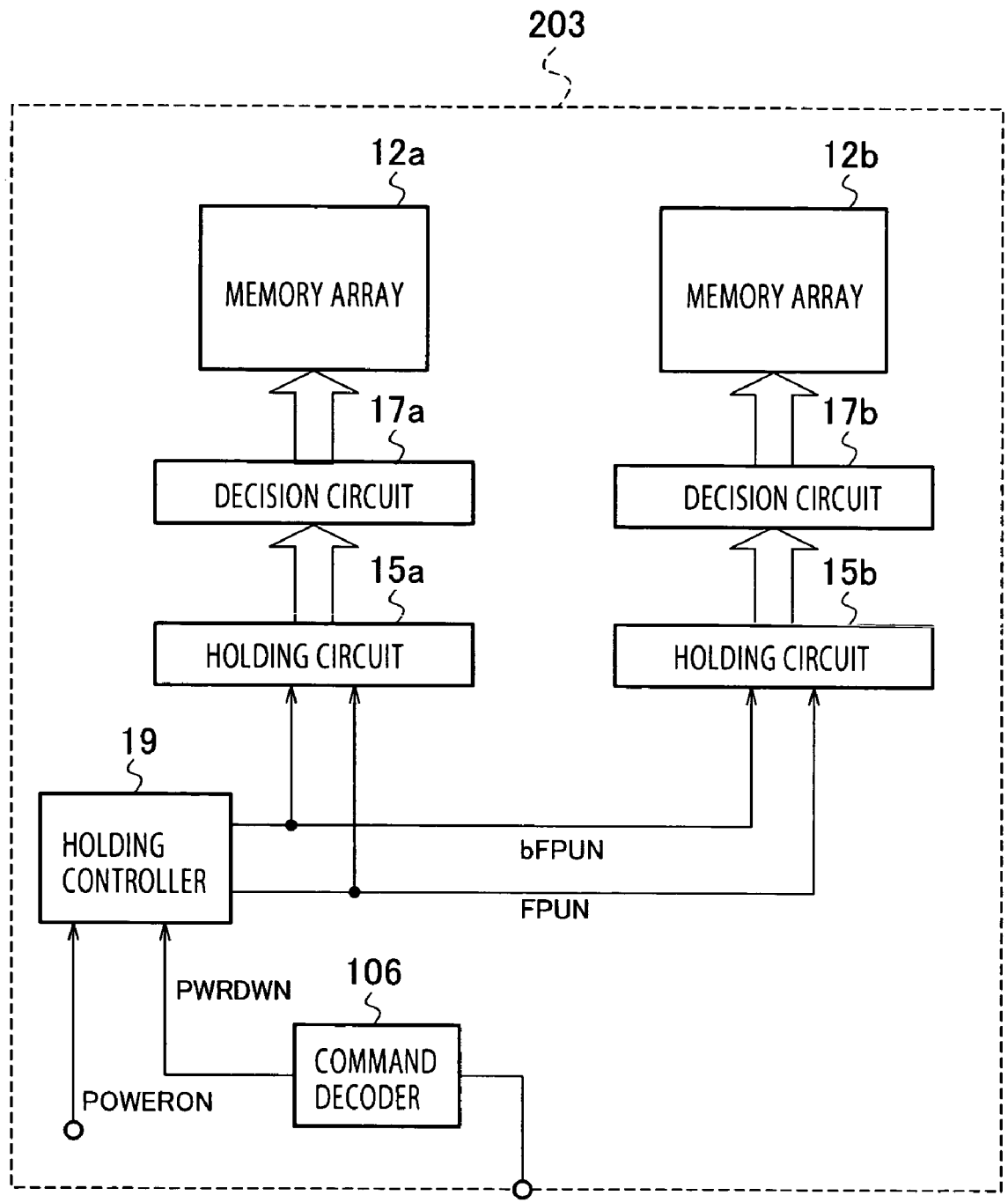
FIG. 12 is a block diagram describing the outline of the semiconductor memory according to the third embodiment of the present invention, and corresponding to a part of the plan view shown in FIG. 11.

FIG. 12 is a block diagram describing the upper side memory cell arrays 12a and 12b of FIG. 11. In FIG. 12, the holding circuits 15a(i−1), 15a(i), 15a(i+1), . . . shown in FIG. 11 are generically represented by the holding circuit 15a, and the holding circuits 15b(i−1), 15b(i), 15b(i+1), . . . are generically represented by the holding circuit 15b. The same configuration applies to the lower side memory cell arrays 12c and 12d of FIG. 11, and duplicate descriptions are omitted. For example, in FIG. 12, a command input to the command decoder is converted to a control signal and is transferred to the holding-controller 19 as output of the command decoder 106.

Figure 13:
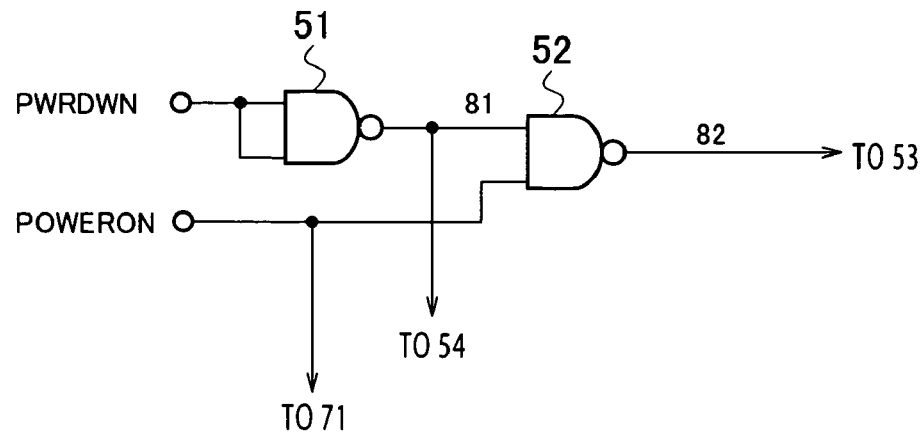
FIG. 13 is a diagram showing significant parts of a holding-controller of the semiconductor memory according to the third embodiment of the present invention.
Figure 14:
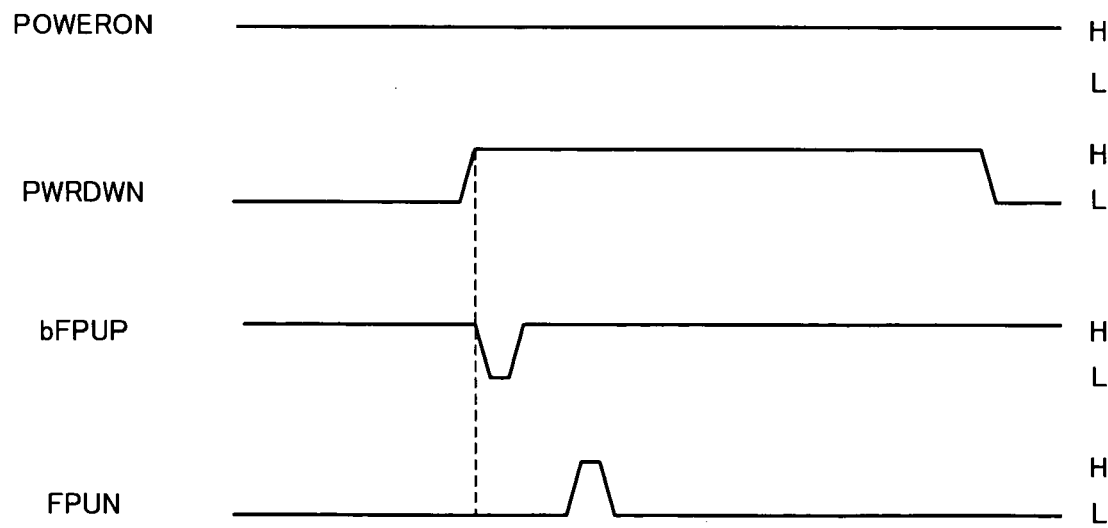
FIG. 14 is a timing chart showing an operation of the holding-controller of the semiconductor memory according to the third embodiment of the present invention.

FIG. 13 is a diagram showing a circuit portion for inputting a command, for example a power down signal, to the holding-controller 19; and FIG. 14 is a timing chart showing an operation of that holding-controller.

As shown in FIG. 13, as a reread signal from the command decoder 106, a power down signal PWRDWN is coupled to the first NAND gate 51, and the node 81 is set to "Low" by the first NAND gate 51 when the power down signal PWRDWN is "High".

In other words, when the reread signal (power down signal) PWRDWN is "High", the initialization signal bFPUP1 and the determination signal FPUN1 can be fed to the holding circuit 15a, as shown in FIG. 14.

Since the reread signal (power down signal) PWRDWN is reset once the fuse information is reread using that reread signal (power down signal) PWRDWN, rereading and holding of the fuse information may be repeated every time the reread signal (power down signal) PWRDWN is set to "High" in conformity with a power down command.

As described above, with the semiconductor memory 203 according to the third embodiment, since rereading and holding of fuse information is carried out simultaneously for all of the memory cell arrays 12a, 12b, 12c, and 12d when they are in an idling state, provision of the holding-controller 19 is unnecessary for every memory cell array 12a, 12b, 12c, and 12d, and thereby allowing a simplified circuit configuration and reduction in chip size. In addition, as with the semiconductor memories according to the first and the second embodiment, even if erroneous fuse information is set, it can be corrected again and again without re-supplying power. Accordingly, since a system with which re-supplying power is difficult can be operated with stability over a long period of time, high reliability is obtainable.

With the semiconductor memory according to the third embodiment, the case of the reread signal being a power down signal has been described; alternatively, it may also be a mode-resister-setting signal. In that case, the power down signal PWRDWN should be replaced with a mode-resister-setting signal MRS, and thus description thereof is omitted. Furthermore, the reread signal may be both the power down signal and the mode-resister-setting signal.

(Fourth Embodiment)

Figure 15:
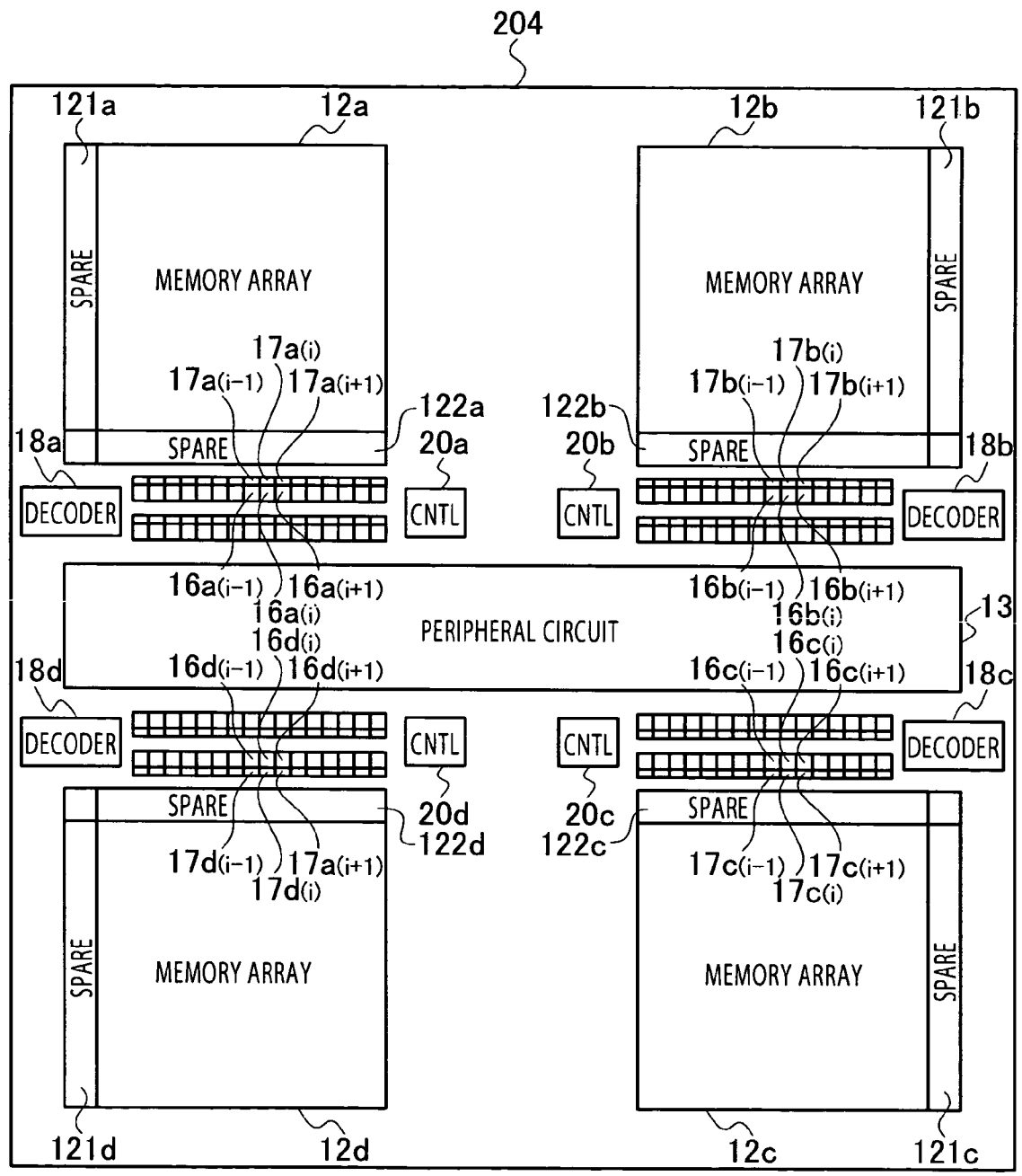
FIG. 15 is a plan view showing a schematic layout on a semiconductor chip of a semiconductor memory according to the fourth embodiment of the present invention.

As shown in FIG. 15, a semiconductor memory 204 according to a fourth embodiment of the present invention embraces a plurality of memory cell arrays 12a, 12b, 12c, and 12d; holding circuits 16a(i−1), 16a(i), 16a(i+1), . . . , 16b(i−1), 16b(i), 16b(i+1), . . . , 16c(i−1), 16c(i), 16c(i+1), . . . , 16d(i−1), 16d(i), 16d(i+1), . . . , which are provided for the memory cell arrays 12a, 12b, 12c, and 12d, respectively, and read and hold fuse information; decision circuits 17a(i−1), 17a(i), 17a(i+1), . . . , 17b(i−1), 17b(i), 17b(i+1), . . . , 17c(i−1), 17c(i), 17c(i+1), . . . , 17d(i−1), 17d(i), 17d(i+1), . . . , which are provided for the memory cell arrays 12a, 12b, 12c and 12d, respectively, and determine which address of memory cell is to be replaced with which spare memory cell based on the fuse information from the holding circuits 16a(i−1), 16a(i), 16a(i+1), . . . , 16b(i−1), 16b(i), 16b(i+1), . . . , 16c(i−1), 16c(i), 16c(i+1), . . . , 16d(i−1), 16d(i), 16d(i+1), . . . , respectively; and holding-controllers 20a, 20b, 20c, and 20d, which are provided for the memory cell arrays 12a, 12b, 12c, and 12d, respectively, and control reading and holding of the fuse information in the holding circuits 16a(i−1), 16a(i), 16a(i+1), . . . , 16b(i−1), 16b(i), 16b(i+1), . . . , 16c(i−1), 16c(i), 16c(i+1), . . . , 16d(i−1), 116d(i), 16d(i+1), . . . by receiving a power supply completion signal and a reread signal (refresh signal). Change-signal decoders 18a, 18b, 18c, and 18d decode changing signals, provide the changing signals as circuit changing signals to the memory cell arrays 12a, 12b, 12c, and 12d or another specified circuit, so as to change the characteristics of a specified circuit or to correct the characteristics of the specified circuit.

In FIG. 15, a peripheral circuit 13 is located in the central region of the semiconductor memory 204, namely between the memory cell arrays 12a and 12b arranged in the upper section and the memory cell arrays 12c and 12d arranged in the lower section. As with the semiconductor memory 201 according to the first embodiment of the present invention, the memory cell array 12a on the upper side includes a column spare memory cell array 121a and a row spare memory cell array 122a. The holding circuits 16a(i−1), 16a(i), 16a(i+1), . . . include banks of fuses corresponding to the column spare memory cell array 121a and the row spare memory cell array 122a, respectively. The upper side memory cell array 12b includes a column spare memory cell array 121b and a row spare memory cell array 122b. The holding circuits 16b(i−1), 16b(i), 16b(i+1), . . . include banks of fuses corresponding to the column spare memory cell array 121b and the row spare memory cell array 122b, respectively. Similarly, the lower side memory cell array 12c includes a column spare memory cell array 121c and a row spare memory cell array 122c, and the lower side memory cell array 12d includes a column spare memory cell array 121d and a row spare memory cell array 122d. The holding circuits 16c(i−1), 16c(i), 16c(i+1), . . . include banks of fuses corresponding to the column spare memory cell array 121c and the row spare memory cell array 122c, respectively, and the holding circuits 16d(i−1), 16d(i), 16d(i+1), . . . include banks of fuses corresponding to the column spare memory cell array 121d and the row spare memory cell array 122d, respectively.

Figure 16:
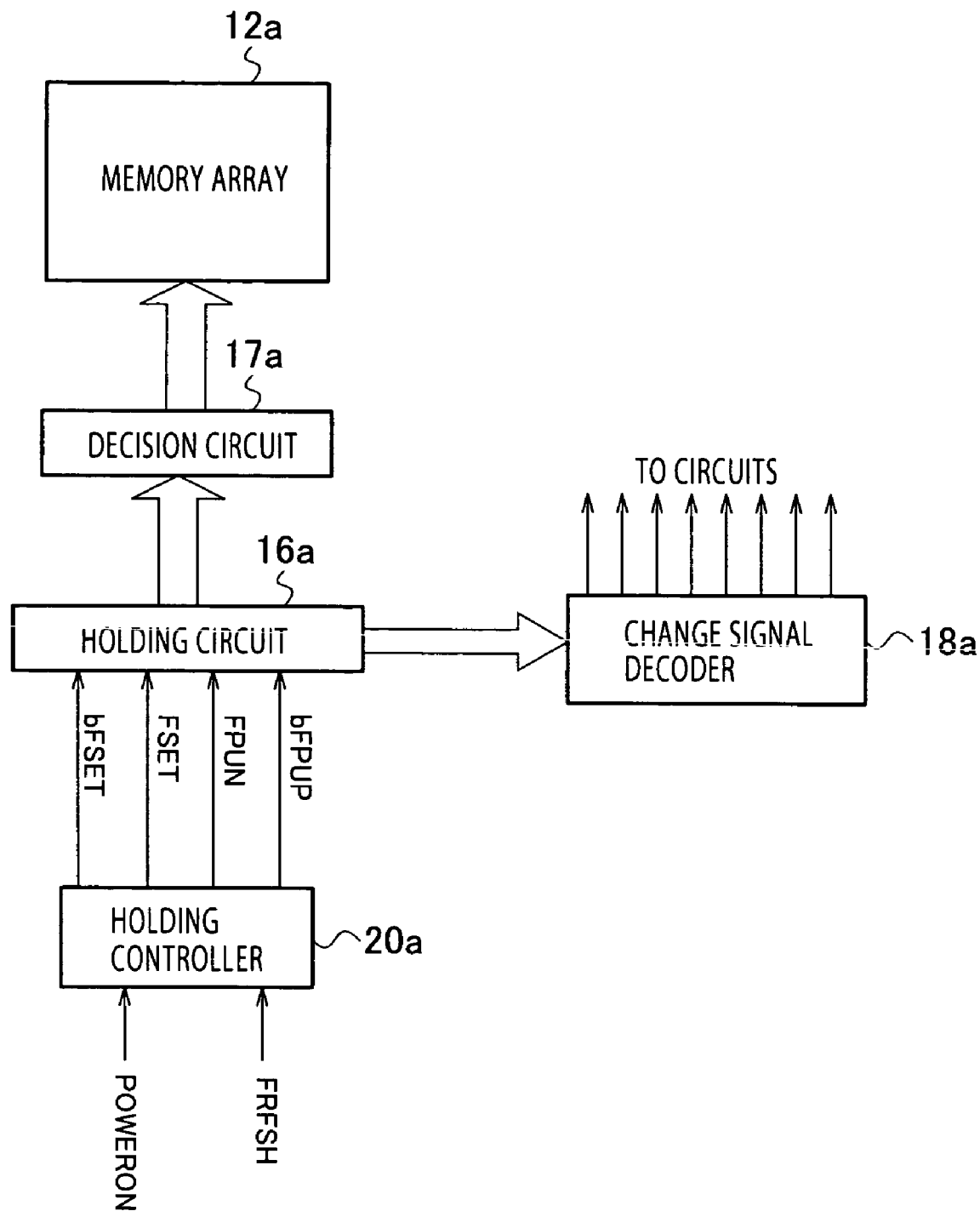
FIG. 16 is a block diagram describing the outline of the semiconductor memory according to the fourth embodiment of the present invention, and corresponding to a part of the plan view shown in FIG. 15.

FIG. 16 is a block diagram focusing on the upper side memory cell array 12a of FIG. 15. In FIG. 16, the holding circuits 16a(i−1), 16a(i), 16a(i+1), . . . shown in FIG. 15 are generically represented by the holding circuit 16a. The same configuration applies to the other memory cell arrays 12b, 12c and 12d of FIG. 15, and duplicate descriptions are omitted. The holding circuit 16a holding fuse information feeds a replacement information signal and a changing signal to the spare memory cell arrays 121a and 122a. The decision circuit 17a determines whether to replace a memory cell using the replacement information signal and feeds a replacement determination result signal for that memory cell. The memory cell array 12a replaces a defective memory cell in conformity with the replacement determination result signal. On the other hand, the change-signal decoder 18a decodes the changing signal and feeds the resulting circuit changing signal to each circuit, allowing change in a specified circuit or correction of a characteristic thereof.

Reading and holding of fuse information are controlled in conformity with an initialization signal bFPUP, a determination signal FPUN, and reading-time signals FSET and bFSET generated by the holding-controller 20a, and are carried out by the holding circuit 16a. The holding-controller 20a receives a power supply completion signal POWERON, which is for notifying that an internal potential has been set once power is supplied to the semiconductor memory. Furthermore, a reread signal FRFSH used for rereading and holding fuse information is also input.

Figure 17:
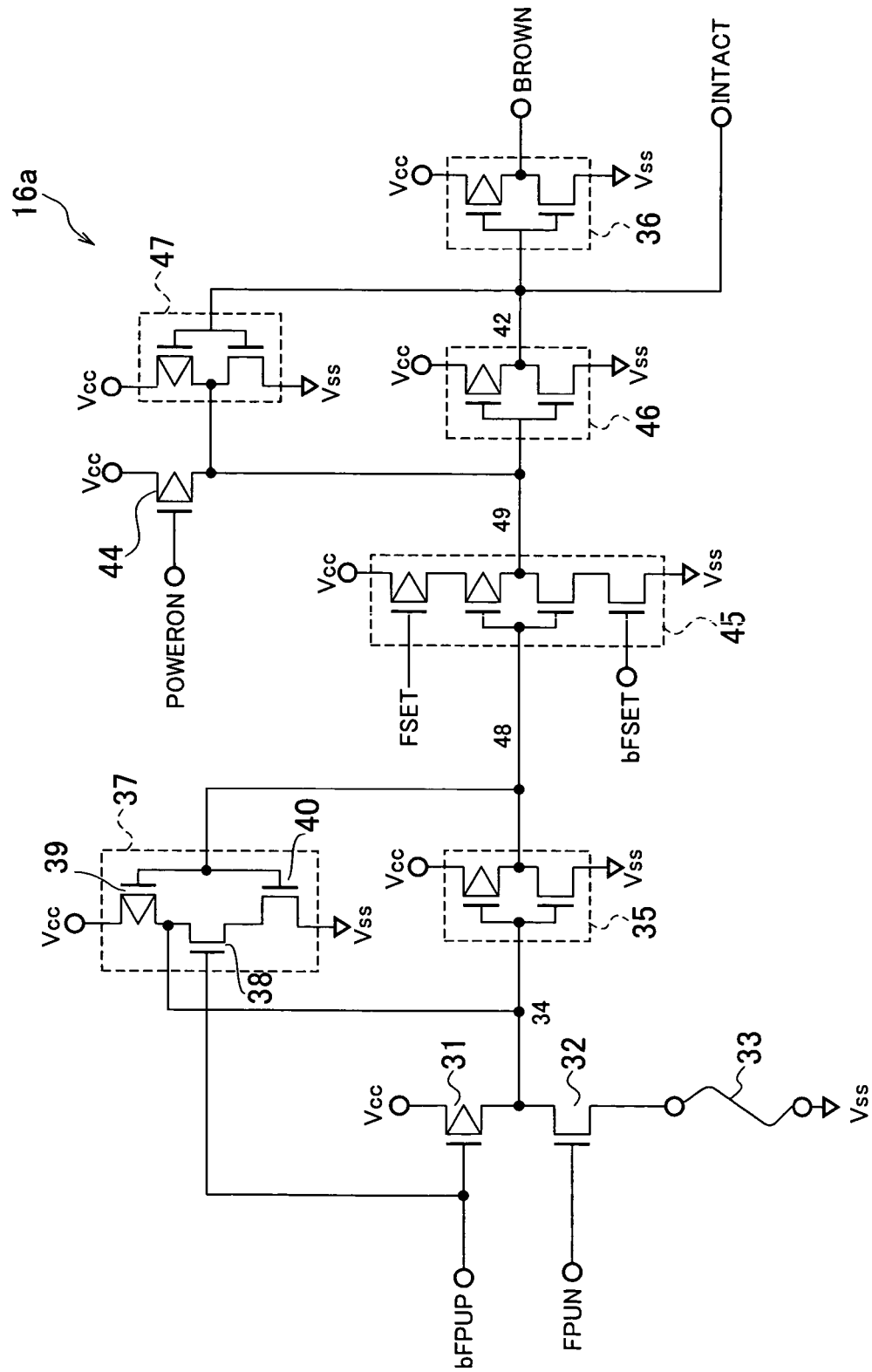
FIG. 17 is a diagram showing a holding circuit 16a of the present invention.

To begin with, the holding circuit 16a is described. As shown in FIG. 17, the holding circuit 16a encompasses: for example, a p-MOSFET 31; an n-MOSFET 32, which has a drain electrode serially connected to the source electrode of the p-MOSFET 31; a fuse 33, which is serially connected between the source electrode of the n-MOSFET32 and a power supply Vss; a first inverter (detecting inverter) 35, which has an input terminal connected to a node 34 connecting the p-MOSFET 31 and the n-MOSFET 32; a second inverter (transferring inverter) 45, which has an input terminal connected to the output terminal of the first inverter (detecting inverter) 35; a third inverter (detected-information-feedback inverter) 37, which also has an input terminal connected to the output terminal of the first inverter (detecting inverter) 35; a fourth inverter (transfer-data-inputting inverter) 46, which has an input terminal connected to the output terminal of the second inverter (transferring inverter) 45; a fifth inverter (output stage inverter) 36, which has an input terminal connected to the output terminal of the fourth inverter (transfer-data-inputting inverter) 46; a sixth inverter (data holding inverter) 47, which also has an input terminal connected to the output terminal of the fourth inverter (transfer-data-inputting inverter) 46; and a p-MOSFET 44, which becomes a pull-up transistor for providing a certain potential for a connection node 49 between the second inverter (transferring inverter) 45 and the fourth inverter (transfer-data-inputting inverter) 46. A power supply completion signal POWERON is transferred to the gate electrode of the p-MOSFET 44.

The output terminal of the third inverter (detected-information-feedback inverter) 37 is connected to the node 34; the n-MOSFET 38 operating as a switch is serially connected between the source electrode of the p-MOSFET 39 and the drain electrode of the n-MOSFET 40 implementing the third inverter (detected-information-feedback inverter) 37; and the gate electrode thereof is connected to the gate electrode of the p-MOSFET 31. In addition, the initialization signal bFPUP1 is transferred to the gate electrode of the p-MOSFET 31, and the determination signal FPUN1 is transferred to the gate electrode of the n-MOSFET 32.

The second inverter (transferring inverter) 45 includes a first p-MOSFET, which connects one of the main electrodes to a higher level power supply (Vcc) and accepts the reading-time signal FSET to the gate electrode thereof; a second p-MOSFET, which connects one of the main electrodes to the other main electrode of the first p-MOSFET and accepts the output of a detection inverter to the gate electrode thereof; a first n-MOSFET, which connects one of the main electrodes to the other main electrode of the second p-MOSFET and accepts the output of the detection inverter to the gate electrode thereof; and a second n-MOSFET, which connects one of the main electrodes to the other main electrode of the first n-MOSFET and accepts an inverted reading-time signal bFSET to the gate electrode thereof. The other main electrode of the second n-MOSFET is connected to the lower level power supply (Vss). Here, 'one of the main electrodes' means one of either the source electrode or the drain electrode of the MOSFET. 'The other main electrode' means one of either the source electrode or the drain electrode of the MOSFET that is not the above-mentioned 'one of the main electrodes'. Since a MOSFET generally takes a symmetrical structure, calling one the source electrode and the other the drain electrode can be chosen arbitrarily. The 'reading-time signal FSET' and the 'inverted reading-time signal bFSET' are signals in opposite phase from each other. The transferring inverter 45 provides an inverted data of the output of the detection inverter 35 to the transfer-data-inputting inverter 46 when the reading-time signal FSET is low level.

The n-MOSFET 38 having an output terminal connected to the node 34 and operating as a switch is serially connected between the source electrode of the p-MOSFET 39 and the drain electrode of the n-MOSFET 40 configuring the third inverter (detected-information-feedback inverter) 37, and the gate electrode thereof is connected to gate electrode of the p-MOSFET 31. In addition, the initialization signal bFPUP1 is transferred to the gate electrode of the p-MOSFET 31, and the determination signal FPUN1 is transferred to the gate electrode of the n-MOSFET 32.

Furthermore, with the fourth inverter (transfer-data-inputting inverter) 46, when the output logic level thereof is "High", a fuse conduction information signal INTACT indicating that the fuse 33 is in a conductive state is transferred. With the output stage inverter 36, when the output logic level thereof is "High", a fuse disconnection information signal BROWN indicating that the fuse 33 is in a disconnected state is transferred.

Figure 18:
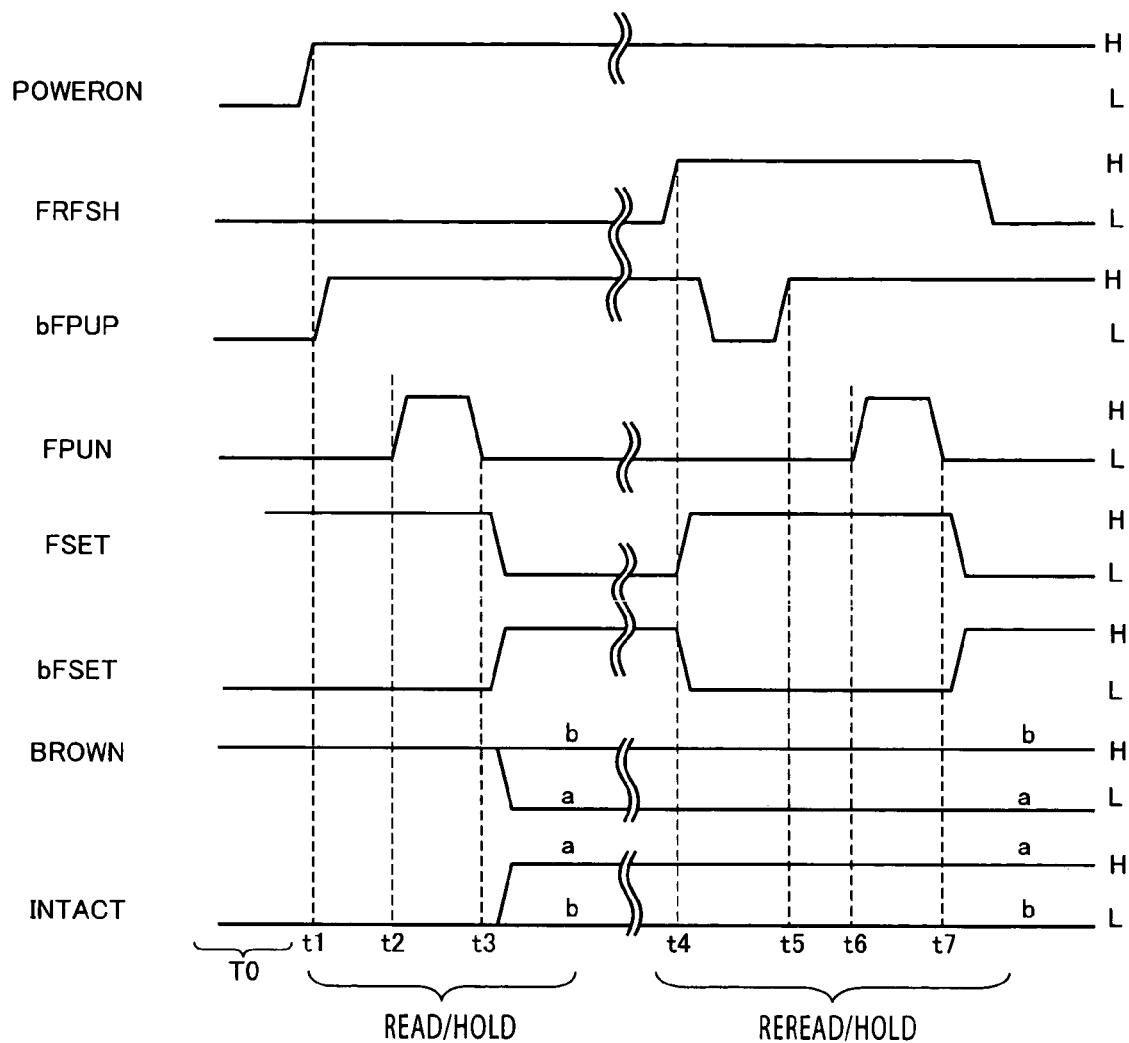
FIG. 18 is a timing chart showing a fuse information holding operation of the present invention.

An operation of the holding circuit 16a shown in FIG. 17 is described while referencing the timing chart of FIG. 18.

(a) Since the initialization signal bFPUP is "Low" and the determination signal FPUN is "Low" during time T0 when the power supply completion signal POWERON is deactivated after power is supplied, the p-MOSFET 31 turns on, the n-MOSFET 32 turns off, and the node 34 is set to an initial value "High". In addition, since the reading-time signal FSET is "High" and bFSET is "Low", the second inverter (transferring inverter) 45 turns off, while since the power supply completion signal POWERON is "Low", the p-MOSFET 44 turns on and the node 49 is set to "High". Accordingly, the fourth inverter (transfer-data-inputting inverter) 46 provides "Low" as the fuse conduction information signal INTACT indicating that the fuse 33 is in a conductive state, and the fifth inverter (output stage inverter) 36 transfers "High" as the fuse disconnection information signal BROWN indicating that the fuse 33 is in a disconnected state. In addition, the sixth inverter (data holding inverter) 47 maintains "High" at the node 49.

(b) Next, at t1 when the power supply completion signal POWERON becomes "High", the initialization signal bFPUP is set to "High" by the holding-controller 20a and the p-MOSFET 31 is turned off, while the third inverter (detected-information-feedback inverter) 37 turns on and the initial state "High" at the node 34 is maintained.

(c) Next, after a specified period of time has passed, at t2, the n-MOSFET 32 turns on when the holding-controller 20a feeds a determination signal FPUN of "High". In this case, when the fuse 33 is conducting, the node 34 is set to "Low", and therefore the node 48 is set to "High" by the first inverter (detecting inverter) 35; however, the node 49 remains as "High" since the second inverter (output stage inverter) 45 remains off. When the fuse 33 is disconnected, the node 34 remains as "High", the node 48 is kept as "High" by the first inverter (detecting inverter) 35, and the node 49 remains as "High" since the second inverter (output stage inverter) 45 remains off. The n-MOSFET 32 is turned off when the holding-controller 20*a* feeds a determination signal FPUN of "Low"; however, since the third inverter (detected-information-feedback inverter) 37 is turned on, the state of the node 34 is maintained.

(d) Subsequently, at t3 when the reading-time signal FSET is set to "Low" and bFSET is set to "High" by the holding-controller 20*a*, the second inverter (transferring inverter) 45 turns on. In this case, since the node 48 is set to "High" when the fuse 33 is conducting, the node 49 is set to "Low" by the second inverter (output stage inverter) 45, the fourth inverter (transfer-data-inputting inverter) 46 provides "High" as the fuse conduction information signal INTACT indicating that the fuse 33 is in a conductive state, and the fifth inverter (output stage inverter) 36 transfers "Low" as the fuse disconnection information signal BROWN indicating that the fuse 33 is in a disconnected state. Since the node 48 is remains as "Low" when the fuse 33 is disconnected, the node 49 remains as "High" even if the second inverter (output stage inverter) 45 turns on, the fourth inverter (transfer-data-inputting inverter) 46 holds an output "Low" as the fuse conduction information signal INTACT indicating that the fuse 33 is in a disconnected state, and the fifth inverter (output stage inverter) 36 holds an output "Low" as the fuse disconnection information signal BROWN indicating that the fuse 33 is in a disconnected state.

(e) In the case of rereading and holding fuse information, to begin with, at t4, the reading-time signal FSET is set to "High" and bFSET is set to "Low" by the holding-controller 20*a*, and the second inverter (transferring inverter) 45 turns off. At this time, since the node 49 is being held by the sixth inverter (data holding inverter) 47, the fourth inverter (transfer-data-inputting inverter) 46 holds the output of the fuse conduction information signal INTACT indicating that the fuse 33 is in a conductive state, and the fifth inverter (output stage inverter) 36 holds the fuse disconnection information signal BROWN indicating that the fuse 33 is in a disconnected state.

(f) Subsequently, at t5, the initialization signal FPUP is set to "High" by the holding-controller 20*a*, the p-MOSFET 31 turns off, and the node 34 is set to an initial value "High".

(g) Next, after a specified period of time has passed, at t6, the n-MOSFET 32 turns on when the holding-controller 20*a* feeds a determination signal FPUN of "High". In this case, when the fuse 33 is conducting, the node 34 is set to "Low", and therefore the node 48 is set to "High" by the first inverter (detecting inverter) 35; however, the node 49 remains as "High" since the second inverter (output stage inverter) 45 remains off. When the fuse 33 is disconnected, the node 34 remains as "High", the node 48 is kept as "High" by the first inverter (detecting inverter) 35, and the node 49 remains as "High" since the second inverter (output stage inverter) 45 remains off. The n-MOSFET 32 is turned off when the holding-controller 20*a* feeds a determination signal FPUN of "Low"; however, since the third inverter (detected-information-feedback inverter) 37 is turned on, the state of the node 34 is maintained.

(h) Subsequently, at t7, when the reading-time signal FSET is set to "Low" and bFSET is set to "High" by the holding-controller 20*a*, the second inverter (transferring inverter) 45 turns on. In this case, when the fuse 33 is conducting, since the node 48 is set to "High", the node 49 is set to "Low" by the second inverter (output stage inverter) 45, the fourth inverter (transfer-data-inputting inverter) 46 provides "High" as the fuse conduction information signal INTACT indicating that the fuse 33 is in a conductive state, and the fifth inverter (output stage inverter) 36 transfers "Low" as the fuse disconnection information signal BROWN indicating that the fuse 33 is in a conductive state. When the fuse 33 is disconnected, the node 48 becomes "Low" and by the second inverter (output stage inverter) 45, the node 49 becomes "High". The fourth inverter (transfer-data-inputting inverter) 46 provides "Low" as the fuse conduction information signal INTACT indicating that the fuse 33 is in a disconnected state, and the fifth inverter (output stage inverter) 36 provides "High" as the fuse disconnection information signal BROWN indicating that the fuse 33 is in a disconnected state. The operation during t6 to t7 is the same as that during t2 to t3, but if the output of the fuse conduction information signal INTACT and the output of the fuse disconnection information signal BROWN holding reread information are the same, the fuse conduction information signal INTACT and the fuse disconnection information signal BROWN do not change.

Figure 19:
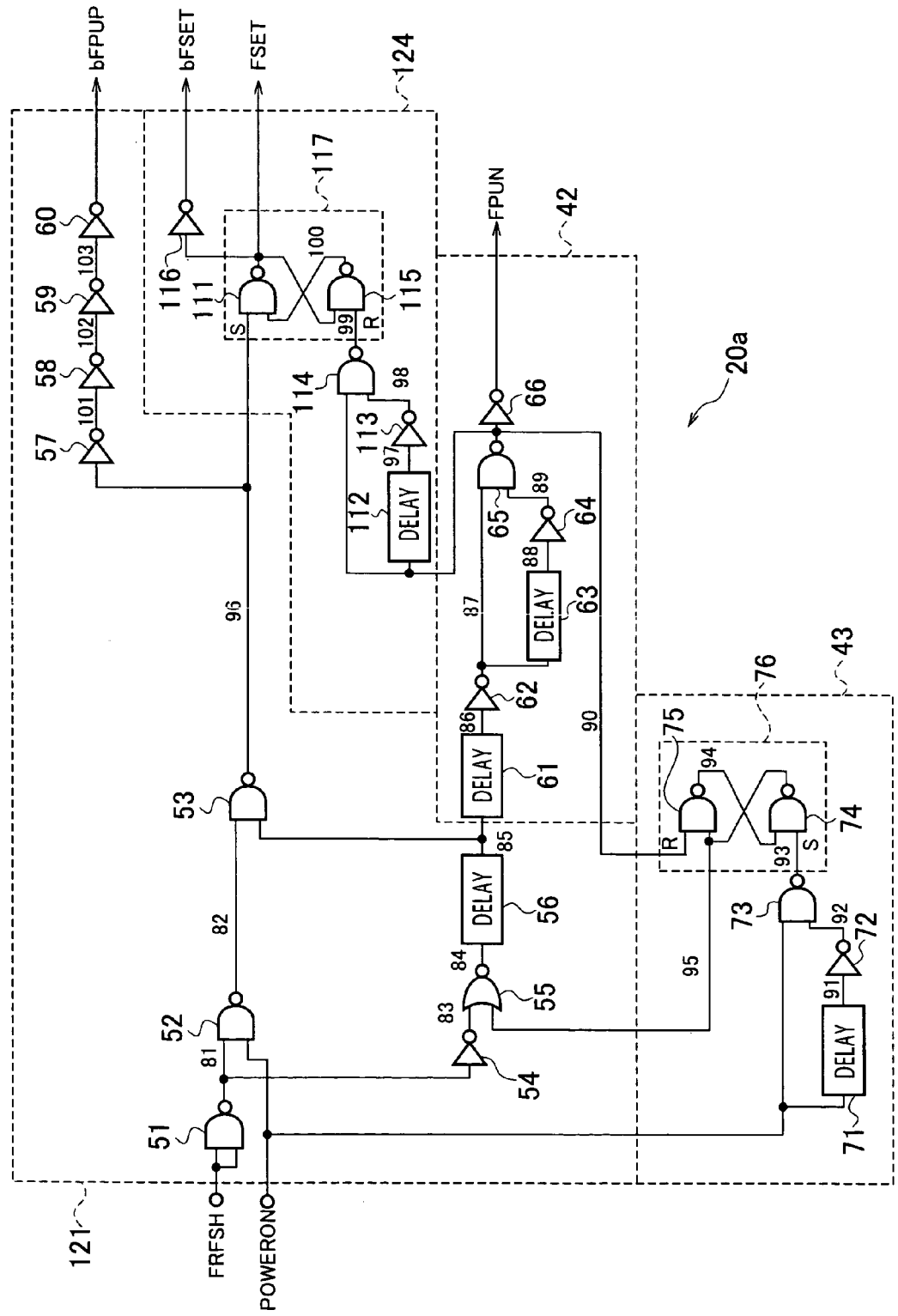
FIG. 19 is a diagram showing a holding-controller 20a of the present invention.

Broadly classified, the holding-controller 20*a* shown in FIG. 19 encompasses an initialization signal generation unit 121, which generates the initialization signal bFPUP, a determination signal generation unit 124, which generates the determination signal FPUN, a synchronizing unit 43, which generates a signal that becomes the basis for FPUN when a power supply completion signal POWERON is issued, and a reading-time signal generation unit 124, which generates the reading-time signals FSET and bFSET, wherein each unit encompasses a group of a predetermined number of circuits necessary for the fuse information.

The initialization signal generation unit 121 encompasses a first NAND gate 51 configured to receive the reread signal FRFSH, a second NAND gate 52, which receives the output from the first NAND gate 51 and the power supply completion signal POWERON, and a NAND gate 53, which accepts a delay signal that delays the output of the first NAND gate 51 through a series circuit of an inverter 54, a NOR gate 55, and a delay circuit 56, and feeds the initialization signal bFPUP via the inverters 57, 58, 59, and 60.

The determination signal generation unit 42 encompasses a series circuit of a delay circuit 61, which further delays the delay signal of the delay circuit 56 in the initialization signal generation unit 121, and an inverter 62, a series circuit of a delay circuit 63, which further delays the output of the inverter 62, and an inverter 62, a NAND gate 65, which generates "Low" by inputting the output of the inverter 62 and the output of the inverter 64 that delayed that output of the inverter 62, and an inverter 66, which delivers a determination signal resulting from inverting the output of the NAND gate 65.

The synchronizing unit 43 encompasses a series circuit of a delay circuit 71 that delays the power supply completion signal POWERON and an inverter 72, a NAND gate 73, which accepts the power supply completion signal POWERON and the output of the inverter 72 that delays the power supply completion signal POWERON, and a flip-flop circuit 76, which has NAND gates 74 and 75. This flip-flop circuit 76 sets "Low" generated from the NAND gate 73 as a set signal, "Low" generated from the NAND gate 65 as a reset signal, and feeds to the NOR gate 55 of the initialization signal generation unit 121.

The reading-time signal generation unit 124 encompasses a series circuit of a delay circuit 112, which delays the output signal of the NAND gate 65 of the determination signal generation unit 42, and an inverter 113; a NAND gate 114, which accepts the output signal of the NAND gate 65 of the determination signal generation unit 42 and the output of the inverter 113 that delays that output signal; a flip-flop circuit 117, which has NAND gates 111 and 115; and an inverter 16, which is connected to the output terminal of the NAND gate 111. The output of the NAND gate 111 is the reading-time signal FSET, and the reading-time signal FSET is inverted by the inverter 116, generating the inverted reading-time signal bFSET.

An operation of the holding circuit 20a shown in FIG. 19 is described while referencing the timing chart of FIG. 18.

(a) During time T0 once power is supplied, the power supply completion signal POWERON is "Low" and the reread signal FRFSH is "Low". With the synchronizing unit 43, the flip-flop circuit 76 enters an initial state and the node 95 is set to "Low". With the initialization signal generation unit 121, since both the node 82, which is the input terminal of the second NAND gate 52, and the node 85 are set to "High", the initialization signal bFPUP becomes "Low". With the determination signal generation unit 42, since the input node 85 is "High", the node 90 is set to "High" and the determination signal FPUN becomes "Low". With the reading-time signal generation unit 124, since the input node 96 is "Low", the flip-flop circuit 117 is in a set state, the reading-time signal FSET becomes "High" and bFSET becomes "Low".

(b) At t1, when the power supply completion signal POWERON is set to "High", with the synchronizing unit 43, "Low" is transferred to the node 93 by a low pulse generation circuit, which encompasses the NAND gate 73, the delay circuit 71, and the inverter 72, the flip-flop circuit 76 enters a set state, and the node 95 is set to "High". With the initialization signal generation unit 121, the node 82 is set to "Low" by the second NAND gate 52, the node 96 id set to "High" by the NAND gate 53, and the initialization signal bFPUP becomes "High". Since the node 95 is "High", the node 84 is set to "Low" by the NOR gate 55, and the node 85 is set to "Low" after being delayed by the delay circuit 56.

(c) With the determination signal generation unit 42, since the node 85 is set to "Low", after being delayed by the delay circuit 61, at t2, the node 86 is set to "Low", and the node 87 is set to "High" by the inverter 62. Therefore, "Low" is transferred to the node 90 by a low pulse generation circuit, which encompasses the NAND gate 65, the delay circuit 63, and the inverter 66, and the determination signal FPUN is transferred as "High" by the inverter 66. With the reading-time signal generation unit 124, the input node 96 is set to "High", but the flip-flop circuit 117 is maintained in a set state.

(d) After "Low" is transferred to the node 90 and is delayed by the delay circuit 63, at t3, "High" is transferred to the node 90 and "Low" is transferred as the determination signal FPUN. In response to the rising edge to "High" at this node 90, a low pulse generation circuit, which encompasses the NAND gate 114, the delay circuit 112, and the inverter 113, provides "Low" to the node 99, and at t3, the flip-flop circuit 117 is reset, the reading-time signal FSET is set to "Low" and bFSET is set to "High". Note that the flip-flop circuit 76 is reset due to "Low" of the node 90 at t2, the node 95 is set to "Low", and the node 84 is set to "High" by the NOR gate 55. Once delayed by the delay circuit 56, the node 85 is set to "High", and after further delay by the delay circuit 61, the node 86 is set to "High", and passed t3, the determination signal FPUN is maintained as "Low".

(e) At t4, when the reread signal FRFSH is set to "High", with the initialization signal generation unit 121, "Low" is generated from the node 96 by a low pulse generation circuit, which encompasses the NAND gate 53, the second NAND gate 52, the delay circuit 56, the NOR gate 55, and the inverter 54. With the reading-time signal generation unit 124, the flip-flop circuit 117 is in a set state at "Low" of the node 96, and the reading-time signal FSET is set to "High" and bFSET is set to "Low". Once delayed by the delay circuit 56, at t5, "High" is generated at the node 96 when the node 85 is set to "Low", and "High" is transferred as the initialization signal bFPUP.

(f) With the determination signal generation unit 42, after the node 85 is set to "Low" at t5 and is delayed by the delay circuit 61, the node 86 is set to "Low", and the node 87 is set to "High" by the inverter 62 at t6. Therefore, "Low" is transferred to the node 90 by the low pulse generation circuit, which encompasses the NAND gate 65, the delay circuit 63, and the inverter 66, and the determination signal FPUN is transferred as "High" by the inverter 66. With the reading-time signal generation unit 124, the input node 96 is set to "High", but the flip-flop circuit 117 is maintained in a set state.

(g) After "Low" is transferred to the node 90 and is delayed by the delay circuit 63, "High" is transferred to the node 90 and "Low" is transferred as the determination signal FPUN at t7. In response to the rising edge to "High" at this node 90, a low pulse generation circuit, which encompasses the NAND gate 114, the delay circuit 112, and the inverter 113, provides "Low" to the node 99, and at t7, the flip-flop circuit 117 is reset, the reading-time signal FSET is set to "Low" and bFSET is set to "High". Note that the flip-flop circuit 76 is reset due to "Low" of the node 90 at t6, the node 95 is set to "Low", and the node 84 is set to "High" by the NOR gate 55. Once delayed by the delay circuit 56, the node 85 is set to "High", and after further delay by the delay circuit 61, the node 86 is set to "High", and passed t7, the determination signal FPUN is maintained as "Low", the reading-time signal FSET as "Low", and bFSET as "High".

Operations of the holding circuit 16a shown in FIG. 17 and of the holding-controller 20a shown in FIG. 19 are as described above. Accordingly, the semiconductor memory according to the fourth embodiment of the present invention operates according to the timing chart shown in FIG. 18. In other words, (a) reading and holding of fuse information immediately after supplying power are as follows. During time T0 after power is supplied, namely while the power supply completion signal POWERON, which is used to detect completion of setting an internal potential, is deactivated ("Low"), the holding-controller 20a activates ("Low") the initialization signal bFPUP, deactivates ("Low") the determination signal FPUN, and activates the reading-time signals FSET and bFSET (H and L, respectively), whereby the fuse information of the holding circuit 16a is in an initialized state. At t1 when the power supply completion signal POWERON is activated ("High"), the initialization signal bFPUP is deactivated ("High") by the holding-controller 20a, and the fuse information in the holding circuit 16a is kept in the initialized state.

(b) After a specified period of time has passed, at t2, the holding-controller 20a activates ("High") the determination signal FPUN, determining the fuse information in the holding circuit 16a.

(c) Subsequently at t3, the holding-controller 20a deactivates ("Low") the determination signal FPUN, and holds the determined fuse information in the holding circuit 16a. Next, the holding-controller 20a deactivates the reading-time signals FSET and bFSET (L and H, respectively), and the holding circuit 16a sends the determined fuse information.

(d) Next, an operation of rereading and holding the fuse information after the power supply completion signal POWERON has been activated is described. At t4 when the reread signal FRFSH used for rereading and holding fuse information is activated ("High"), the holding-controller 20a activates the reading-time signals FSET and bFSET (H and L, respectively), and the holding circuit 16a maintains a replacement information signal currently being sent and a characteristic change/correction information signal.

(e) Subsequently at t5, the holding-controller 20a deactivates ("High") the initialization signal bFPUP, and the fuse information in the holding circuit 16a is initialized. At this time, the fuse information is initialized, but the information of the replacement information signal and the characteristic change/correction information signal is kept as it is.

(g) After a specified period of time has passed, at t6, the holding-controller 20a activates ("High") the determination signal FPUN, determining the fuse information in the holding circuit 16a.

(g) Subsequently at t7, the holding-controller 20a deactivates ("Low") the determination signal FPUN, and holds the determined fuse information in the holding circuit 16a. Even at this time, the information of the replacement information signal and the characteristic change/correction information signal is still kept as it is. Further thereafter, the holding-controller 20a deactivates the reading-time signals FSET and bFSET (L and H, respectively), and the holding circuit 16a stops holding the held information of the replacement information signal and the characteristic change/correction information signal, and then sends the read fuse information.

As described above, according to the semiconductor memory of the fourth embodiment, correction of the set state of any erroneous fuse information into correct fuse information can be made without re-supplying power, and fuse information can be corrected regardless of the memory cell arrays 12a, 12b, 12c and 12d being in an idling state or not. With the semiconductor memory according to the first embodiment, when the holding circuits 15a, 15b, 15c, and 15d reread the fuse information, information of the fuse being in a disconnected state is sent. In other words, before correct fuse information is sent due to rereading of the fuse information, the fuse disconnection information signal BROWN is always activated ("High"), the fuse conduction information signal INTACT is deactivated ("Low"), and the information of the fuse being in a disconnected state is sent. Accordingly, as shown in the time chart of FIG. 4, the holding circuits 15a, 15b, 15c, and 15d can reread and hold fuse information only when other operations are not adversely affected even if the holding circuit 15a, 15b, 15c, and 15c send information of the fuse being in a disconnected state along with rereading the fuse information. Therefore, with the first embodiment, this problem can be avoided by rereading and holding the fuse information of the fuse used for replacement information for the spare memory cell arrays when the memory cell array corresponding to that fuse is in an idling state. Accordingly, with the semiconductor memory according to the first embodiment, it is difficult to reread and hold fuse information of the fuse that is used for changing a circuit or correcting a characteristic thereof. This is because there are many purposes for changing each fuse.

According to the semiconductor memory of the fourth embodiment, it is unnecessary to provide for each fuse a holding-controller that rereads and holds fuse information when other operations are not adversely affected, and therefore even in the case where there are many purposes for changing using each fuse, that semiconductor memory can flexibly handle the case. In addition, there are also fuses with a prime purpose for which sending unexpected fuse information is not allowed. For example, the rereading and holding of fuse information can be achieved, associated with fuse that is used to decide the word organization of the semiconductor memory or a fuse that is used to change the power supply voltage in the semiconductor memory. In other words, according to semiconductor memory of the fourth embodiment, in the case of rereading and holding fuse information, these operations are carried out without the fuse information signal being initialized, and thus rereading and holding the fuse information is possible regardless of the operating states of the memory cell arrays 12a, 12b, 12c, and 12d. Furthermore, even for a fuse use for changing a circuit or correcting a characteristic thereof, fuse information can be reread and held anytime regardless of the purpose of that fuse.

(Fifth Embodiment)

Figure 20:
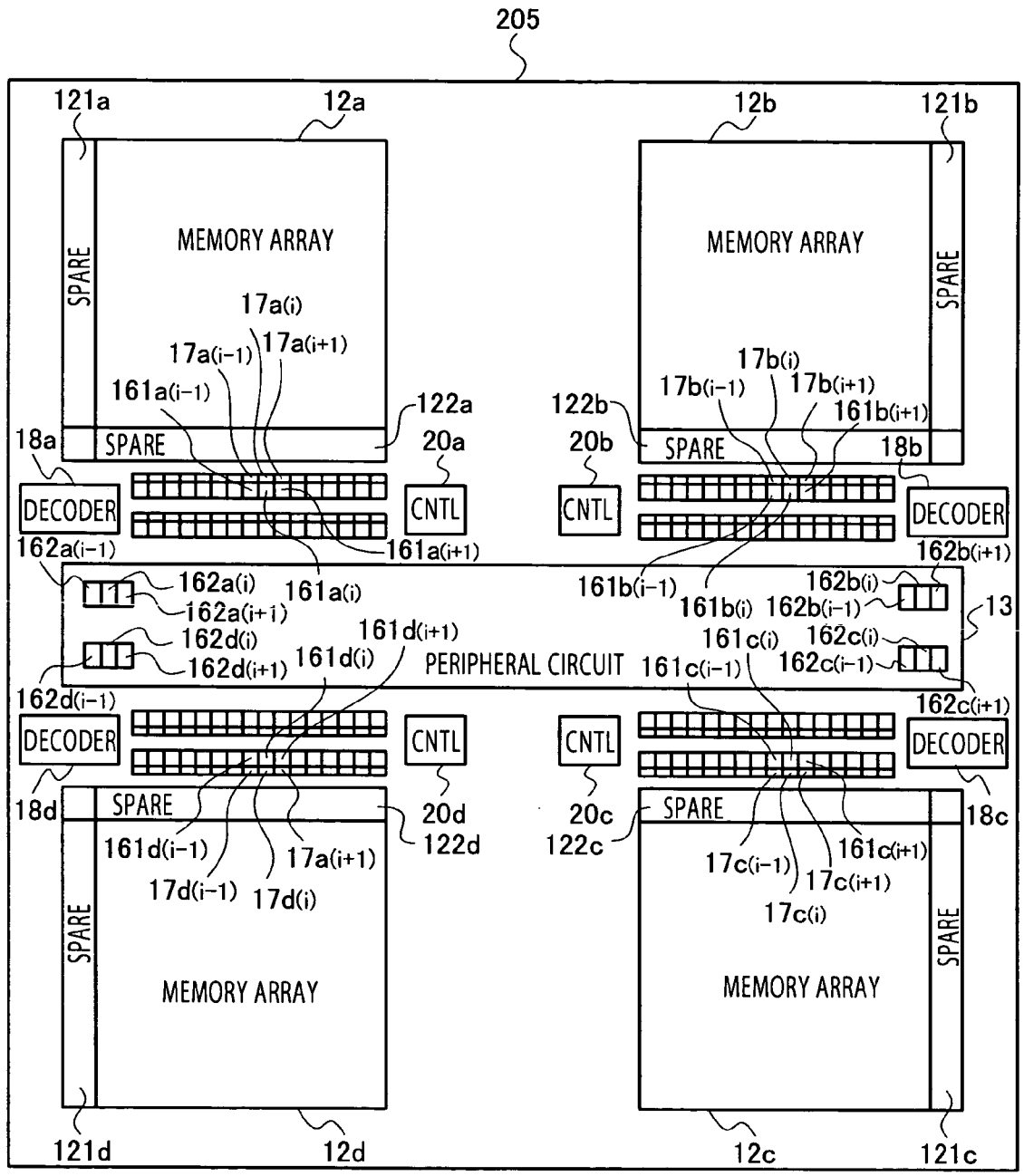
FIG. 20 is a plan view showing a schematic layout on a semiconductor chip of a semiconductor memory according to the fifth embodiment of the present invention.

As shown in FIG. 20, a semiconductor memory 205 according to a fifth embodiment of the present invention embraces a plurality of memory cell arrays 12a, 12b, 12c, and 12d; first holding circuits 161a(i−1), 161a(i), 161a(i+1), . . . , 161b(i−1), 161b(i), 161b(i+1), . . . , 161c(i−1), 161c(i), 161c(i+1), . . . , 161d(i−1), 161d(i), 161d(i+1), . . . , which are provided for the memory cell arrays 12a, 12b, 12c, and 12d, respectively, and read and hold fuse information; second holding circuits 162a(i−1), 162a(i), 162a(i+1), . . . , 162b(i−1), 162b(i), 162b(i+1), . . . , 162c(i−1), 162c(i), 162c(i+1), . . . , 162d(i−1), 162d(i), 162d(i+1), . . . , configured to reread and hold fuse information of banks of characteristic-changing fuses, which are adapted for changing and correcting the characteristics of a specified circuit; decision circuits 17a(i−1), 17a(i), 17a(i+1), . . . , 17b(i−1), 17b(i), 17b(i+1), . . . , 17c(i−1), 17c(i), 17c(i+1), . . . , 17d(i−1), 17d(i), 17d(i+1), . . . , which are provided for the memory cell arrays 12a, 12b, 12c and 12d, respectively, and determine which address of memory cell is to be replaced with which spare memory cell based on the fuse information from the first holding circuits 161a(i−1), 161a(i), 161a(i+1), . . . , 161b(i−1), 161b(i), 161b(i+1), . . . , 161c(i−1), 161c(i), 161c (i+1), . . . , 161d(i−1), 161d(i), 161d(i+1), . . . , respectively; and holding-controllers 20a, 20b, 20c, and 20d, which are provided for the memory cell arrays 12a, 12b, 12c, and 12d, respectively, and control reading and holding of the fuse information in the first holding circuits 161a(i−1), 161a(i), 161a(i+1), . . . , 161b (i−1), 161b(i), 161b(i+1), . . . , 161c(i−1), 161c(i), 161c(i+1), . . . , 161d(i−1), 161d(i), 161d(i+1), . . . by receiving a power supply completion signal and a reread signal (refresh signal). Change-signal decoders 18a, 18b, 18c, and 18d decode change-information signals from the second holding circuits 162a(i−1), 162a(i), 162a(i+1), . . . , 162b(i−1), 162b(i), 162b(i+1), . . . , 162c(i−1), 162c(i), 162c(i+1), . . . , 162d(i−1), 162d(i), 162d(i+1), . . . , respectively, and provides the circuit changing signal to each of the memory cell arrays 12a, 12b, 12c, and 12d or an external specified circuit.

In FIG. 20, a peripheral circuit 13 is located in the central region of the semiconductor memory 205, namely between the upper memory cell arrays 12a and 12b and the lower memory cell arrays 12c and 12d. Furthermore, the second holding circuits 162a(i−1), 162a(i), 162a(i+1), . . . , 162b (i−1), 162b(i), 162b(i+1), . . . , 162c(i−1), 162c(i), 162c(i+1), . . . , 162d(i−1), 162d(i), 162d(i+1), . . . are also located in a part of the peripheral circuit 13 area.

As with the semiconductor memory 201 according to the first embodiment of the present invention, the memory cell array 12a on the upper side includes a column spare memory cell array 121a and a row spare memory cell array 122a. The first holding circuits 161a(i−1), 161a(i), 161a(i+1), . . . include banks of fuses corresponding to the column spare memory cell array 121a and the row spare memory cell array 122a, respectively. The upper side memory cell array 12b includes a column spare memory cell array 121b and a row spare memory cell array 122b. The first holding circuits 161b(i−1), 161b(i), 161b(i+1), . . . include banks of fuses corresponding to the column spare memory cell array 121b and the row spare memory cell array 122b, respectively. Similarly, the lower side memory cell array 12c includes a column spare memory cell array 121c and a row spare memory cell array 122c, and the lower side memory cell array 12d includes a column spare memory cell array 121d and a row spare memory cell array 122d. The first holding circuits 161c(i−1), 161c(i), 161c(i+1), . . . include banks of fuses corresponding to the column spare memory cell array 121c and the row spare memory cell array 122c, respectively, and the holding circuits 161d(i−1), 161d(i), 161d(i+1), . . . include banks of fuses corresponding to the column spare memory cell array 121d and the row spare memory cell array 122d, respectively.

The semiconductor memory according to the fifth embodiment shown in FIG. 20 differs from the semiconductor memory 205 according to the fourth embodiment shown in FIG. 15 in that the holding circuits 16a(i−1), 16a(i), 16a(i+1), . . . , 16b(i−1), 16b(i), 16b(i+1), . . . , 16c(i−1), 16c(i), 16c(i+1), . . . , 16d(i−1), 16d(i), 16d(i+1), . . . of FIG. 15 are divided into two types: the first holding circuits 161a(i−1), 161a(i), 161a(i+1), . . . , 161b(i−1), 161b(i), 161b(i+1), . . . , 161c(i−1), 161c(i), 161c(i+1), . . . , 161d(i−1), 161d(i), 161d(i+1), . . . for replacement information signals for spare memory cell arrays 121a, 122a, 121b, 122b, 121c, 122c, 121d, and 122d; and the second holding circuits 162a(i−1), 162a(i), 162a(i+1), . . . , 162b(i−1), 162b(i), 162b(i+1), . . . , 162c(i−1), 162c(i), 162c(i+1), . . . , 162d(i−1), 162d(i), 162d(i+1), . . . for generating the change-information signals.

With the fifth embodiment, since rereading and holding fuse information in the second holding circuits 162a(i−1), 162a(i), 162a(i+1), . . . , 162b(i−1), 162b(i), 162b(i+1), . . . , 162c(i−1), 162c(i), 162c(i+1), . . . , 162d(i−1), 162d(i), 162d(i+1), . . . for generating the change-information signals can be carried out regardless of other operations, rereading and holding of fuse information in the second holding circuits 162a(i−1), 162a(i), 162a(i+1), . . . , 162b(i−1), 162b(i), 162b(i+1), . . . , 162c(i−1), 162c(i), 162c(i+1), . . . , 162d(i−1), 162d(i), 162d(i+1), . . . and of fuse information of characteristic-changing fuses can be carried out synchronized with when rereading and holding fuse information in the holding circuits 16a(i−1), 16a(i), 16a(i+1), . . . , 16b(i−1), 16b(i), 16b(i+1), . . . , 16c(i−1), 16c(i), 16c(i+1), . . . , 16d(i−1), 16d(i), 16d(i+1), . . . . Therefore, complicated operating steps such as rereading and holding of fuse information of fuses corresponding to the memory cell arrays 12a, 12b, 12c, and 12d when in an idling state as with those in the first embodiment need not be performed.

Figure 21:
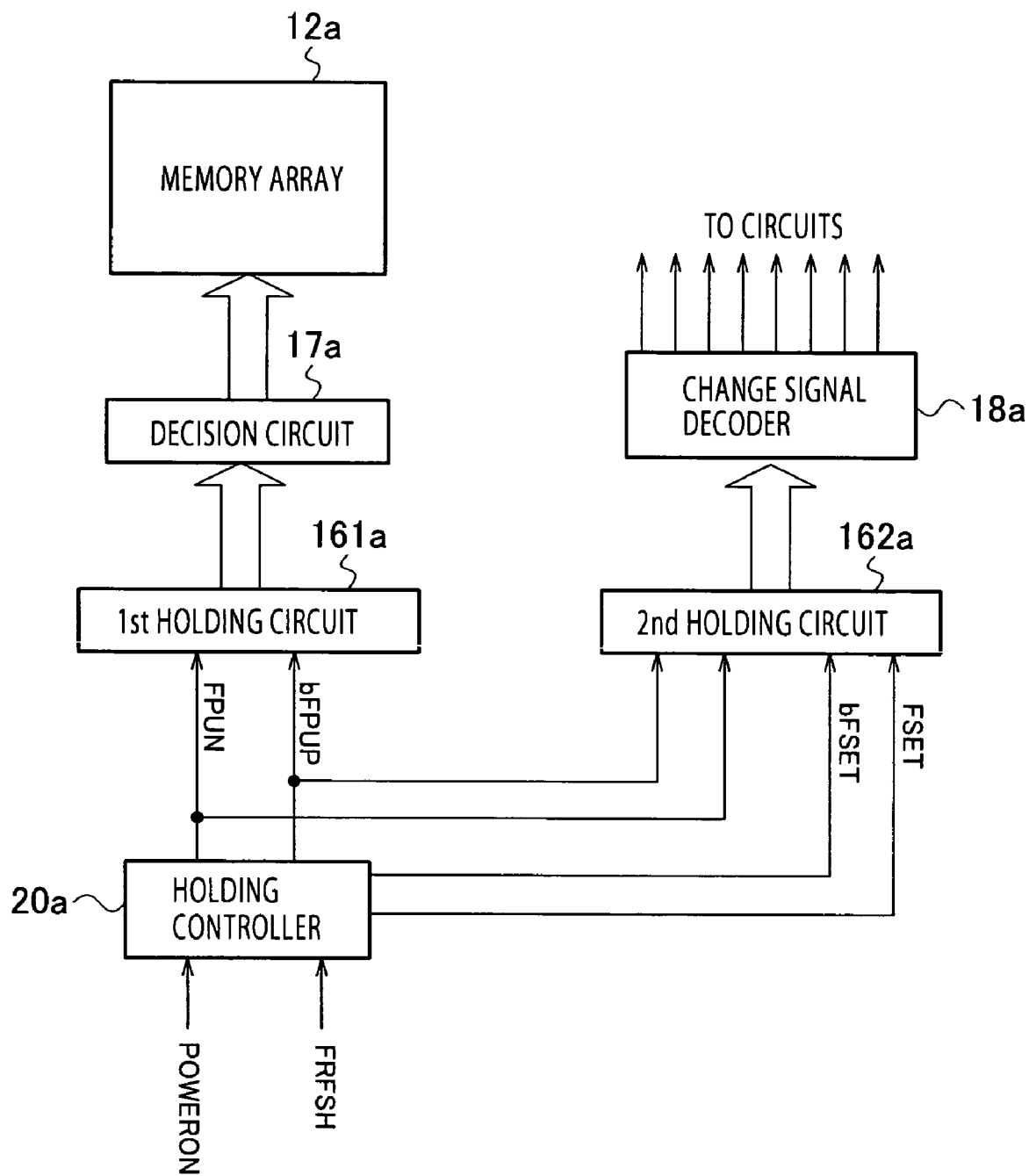
FIG. 21 is a block diagram describing the outline of the semiconductor memory according to the fifth embodiment of the present invention, and corresponding to a part of the plan view shown in FIG. 20.

FIG. 21 is a block diagram focusing on the upper side memory cell array 12a of FIG. 20. In FIG. 21, the first holding circuits 161a(i−1), 161a(i), 161a(i+1), . . . shown in FIG. 20 are generically represented by the holding circuit 161a. The same configuration applies to the other memory cell arrays 12b, 12c and 12d of FIG. 20, and duplicate descriptions are omitted. In FIG. 21, the first holding circuit 161a(i−1), 161a(i), 161a(i+1), . . . shown in FIG. 20 are generically represented by "the first holding circuit 161a", and the second holding circuit 162a(i−1), 162a(i), 162a(i+1), . . . shown in FIG. 20 are generically represented by "the second holding circuit 162a".

The circuit shown in FIG. 3 of the first embodiment is available as the first holding circuit 161a for replacement information signals used for replacement with the spare memory cell arrays 121a, 122a. With this first holding circuit 161a, since a fuse information signal is initialized when rereading and holding the fuse information, the replacement information signals for the spare memory cell arrays 121a and 122a enter an initialized state once. Therefore, a devise disclosed in the first embodiment, namely rereading and holding fuse information of fuses corresponding to memory cell arrays when in an idling state needs to be implemented. With the fifth embodiment even in this case, since rereading and holding the fuse information in the second holding circuit 162a for the change-information signals can be carried out regardless of other operations, rereading and holding of the fuse information in the second holding circuit 162a and of fuse information of the characteristic-changing fuses can be carried out synchronized with when rereading and holding the fuse information in the holding circuit 161a.

With the fifth embodiment, usage of a circuit as shown in FIG. 1 having a simple structure with few elements for the first holding circuit 161a, which is for replacement information signals for replacement with an extremely large number of spare memory cell arrays 121a, 122a, allows further control of chip surface area than with the fourth embodiment.

According to the semiconductor memory of the fifth embodiment, once rereading and holding of fuse information is carried out regardless of the intended purpose of that fuse, even if that fuse information is changed to be in an incorrect state, the semiconductor memory can correct that erroneous fuse information while operating.

(Other Embodiments)

Various modifications will become possible for those skilled in the art after receiving the teaching of the present disclosure without departing from the scope thereof.

With the already given descriptions of the first through fifth embodiments, the case of a semiconductor memory including four memory cell arrays 12a, 12b, 12c, and 12d has been described; however, the present invention is not limited to four memory cell arrays, and may be used for a semiconductor memory including one to three memory cell arrays, or one including even more memory cell arrays. Furthermore, the present invention is also applicable to a semiconductor integrated circuit such as a system LSI integrated at the same time as various logic circuits.

Thus, the present invention of course includes various embodiments and modifications and the like which are not detailed above. Therefore, the scope of the present invention will be defined in the following claims.

What is claimed is:

1. A semiconductor memory comprising:
   a memory cell array having a spare memory cell array;
   a holding circuit having banks of fuses, configured to read and hold fuse information;

a decision circuit configured to determine which address of memory cell is to be replaced with which spare memory cell based on the fuse information from the holding circuit; and a holding-controller configured to control reading and holding of the fuse information in the holding circuit by receiving a power supply completion signal and a refresh signal, wherein the holding circuit rereads the fuse information when the reread signal is generated, after the holding circuit reads once the fuse information by receiving the power supplying completion signal.

2. The semiconductor memory of claim 1, further comprising a refresh controller configured to deliver refresh signals as the reread signals.

3. The semiconductor memory of claim 2, wherein the reading of the fuse information into the holding circuit by the refresh signal is carried out in a period outside of refresh period of the memory cell array.

4. The semiconductor memory of claim 2, further comprising a counter configured to count refresh signals, wherein the refresh signal is employed as a first reread signal and an output from the counter are employed as a second reread signal for rereading the fuse information.

5. The semiconductor memory of claim 4, wherein the reading of the fuse information into the holding circuit by the second reread signal is carried out in a period outside of refresh period of the memory cell array.

6. The semiconductor memory of claim 1, further comprising a command decoder configured to convert an input command to the reread signal and to supply the reread signal to the holding-controller.

7. The semiconductor memory of claim 6, wherein the command decoder provides a power down signal as the reread signal.

8. The semiconductor memory of claim 6, wherein the command decoder provides a mode-resister-setting signal as the reread signal.

9. The semiconductor memory of claim 2, wherein the holding-controller comprises:
a first NAND gate configured to receive the reread signal; and
a second NAND gate configured to receive an output from the first NAND gate and the power supply completion signal,
wherein the holding circuit rereads the fuse information by an output signal from the first NAND gate based upon the reread signal, after the holding circuit reads once the fuse information by receiving the power supplying completion signal.

10. The semiconductor memory of claim 4, wherein the holding-controller comprises:
a first NAND gate configured to receive the first and second reread signals; and
a second NAND gate configured to receive an output from the first NAND gate and the power supply completion signal,
wherein the holding circuit rereads the fuse information by an output signal from the first NAND gate based upon the first and second reread signals, after the holding circuit reads once the fuse information by receiving the power supplying completion signal.

11. The semiconductor memory of claim 1, further comprising a change-signal decoder configured to provide a circuit changing signal, which changes characteristics of a specified circuit in or outside of the memory cell.

12. The semiconductor memory of claim 11, further comprising a second holding circuits having banks of characteristic-changing fuses adapted for changing and correcting the characteristics of a specified circuit, configured to reread and hold fuse information of the characteristic-changing fuses, and to provide a change-information signal to the change-signal decoder, wherein the change-signal decoder decodes the change-information signal so as to generate the circuit changing signal.

13. The semiconductor memory of claim 4, wherein the holding circuit comprises:
a p-MOSFET having a gate electrode configured to receive an initialization signal of the fuse information;
an n-MOSFET having a drain electrode serially connected to a source electrode of the p-MOSFET and a gate electrode configured to receive a determination signal of the fuse information;
a fuse serially connected between the source electrode of the n-MOSFET and a power supply;
a detecting inverter having an input terminal connected to a node connecting the p-MOSFET and the n-MOSFET;
an output stage inverter having an input terminal connected to the output terminal of the detecting inverter; and
a detected-information-feedback inverter having an input terminal connected to an output terminal of the detecting inverter,
wherein the holding circuit provides a high level signal from the output stage inverter as a fuse disconnection information signal, when the fuse is in a disconnected state.

14. The semiconductor memory of claim 13, further comprising:
a transferring inverter having an input terminal connected to the output terminal of the detecting inverter;
a transfer-data-inputting inverter having an input terminal connected to an output terminal of the transferring inverter and having an output terminal connected to the output stage inverter; and
a data holding inverter having an input terminal connected to the output terminal of the transfer-data-inputting inverter and having an output terminal connected to the input terminal of the transfer-data-inputting inverter.

15. The semiconductor memory of claim 14, wherein the transferring inverter comprises:
a first p-MOSFET connecting one of main electrodes to a higher level power supply and accepts a reading-time signal to a gate electrode thereof;
a second p-MOSFET connecting one of main electrodes to the other main electrode of the first p-MOSFET and accepts an output of the detection inverter to a gate electrode thereof;
a first n-MOSFET connecting one of main electrodes to the other main electrode of the second p-MOSFET and accepts an output of the detection inverter to a gate electrode thereof; and
a second n-MOSFET connecting one of main electrodes to the other main electrode of the first n-MOSFET and accepts an inverted reading-time signal to a gate electrode thereof,
wherein an output of the detecting inverter is transferred to the transfer-data-inputting inverter when the reading-time signal is high level.

16. The semiconductor memory of claim 14, wherein a plurality of memory cell arrays, each having the spare memory cell array, are monolithically integrated on a same semiconductor chip.

17. The semiconductor memory of claim 14, wherein each of the memory cell arrays comprises the holding circuit, the decision circuit and the holding-controller.

18. The semiconductor memory of claim 14, further comprising a refresh controller configured to deliver refresh signals as the reread signals to each of the holding-controllers.

19. The semiconductor memory of claim 14, further comprising a counter connected to the refresh controller and to each of the holding-controllers, configured to count refresh signals, wherein the refresh signal is employed as a first reread signal and an output from the counter are employed as a second reread signal for rereading the fuse information.

\* \* \* \* \*